(12) United States Patent
Maruyama

(10) Patent No.: US 6,972,984 B2
(45) Date of Patent: Dec. 6, 2005

(54) FERROELECTRIC MEMORY DEVICE

(75) Inventor: Akira Maruyama, Yokohama (JP)

(73) Assignee: Seiko Epson Corporation, Tokyo (JP)

(*) Notice: Subject to any disclaimer, the term of this patent is extended or adjusted under 35 U.S.C. 154(b) by 123 days.

(21) Appl. No.: 10/737,959

(22) Filed: Dec. 18, 2003

(65) Prior Publication Data

US 2004/0145936 A1  Jul. 29, 2004

(30) Foreign Application Priority Data

Jan. 15, 2003  (JP) .............................. 2003-007405

(51) Int. Cl.$^7$ ............................................. G11C 11/22
(52) U.S. Cl. .................... 365/145; 365/65; 365/230.06
(58) Field of Search .......................... 365/145, 65, 226, 365/230.06

(56) References Cited

U.S. PATENT DOCUMENTS

| | | | | |
|---|---|---|---|---|
| 5,305,255 A | * | 4/1994 | Rubinstein | 365/145 |
| 5,532,953 A | * | 7/1996 | Ruesch et al. | 365/145 |
| 6,154,387 A | * | 11/2000 | Takata | 365/145 |
| 6,795,351 B2 | * | 9/2004 | Sakai | 365/189.09 |

FOREIGN PATENT DOCUMENTS

JP  A 9-116107  5/1997

OTHER PUBLICATIONS

U.S. Appl. No. 10/393,439, filed Mar. 20, 2003, Yamamura.
U.S. Appl. No. 10/754,691, filed Jan. 12, 2004, Maruyama.
U.S. Appl. No. 10/747,523, filed Dec. 30, 2003, Maruyama.
U.S. Appl. No. 10/747,395, filed Dec. 30, 2003, Maruyama.
U.S. Appl. No. 10/752,184, filed Jan. 7, 2004, Maruyama.
U.S. Appl. No. 10/758,179, filed Jan. 16, 2004, Yamamura.

* cited by examiner

Primary Examiner—Tan T. Nguyen
(74) Attorney, Agent, or Firm—Oliff & Berridge, PLC

(57) ABSTRACT

A ferroelectric memory device enabling high-speed access has a voltage selection circuit and a potential gradient correction section. The voltage selection circuit selects a plurality of different voltages generated by a power circuit and outputs them to voltage supply lines, fixing the potential of either the unselected-word-line-voltage-supply-line or the unselected-bit-line-voltage-supply-line. The potential gradient correction section reduces one difference in potential gradient on a side with no fixed potential, which is either the difference between the potential gradient of the selected-word-line-voltage-supply-line and the potential gradient of the unselected-bit-line-voltage-supply-line, or the difference between the potential gradient of the selected bit line voltage supply line and the potential gradient unselected-word-line-voltage-supply-line.

14 Claims, 23 Drawing Sheets

VOLTAGE RISE GRADIENT COMPARISON

VOLTAGE RISE GRADIENT COMPARISON

FIG. 34
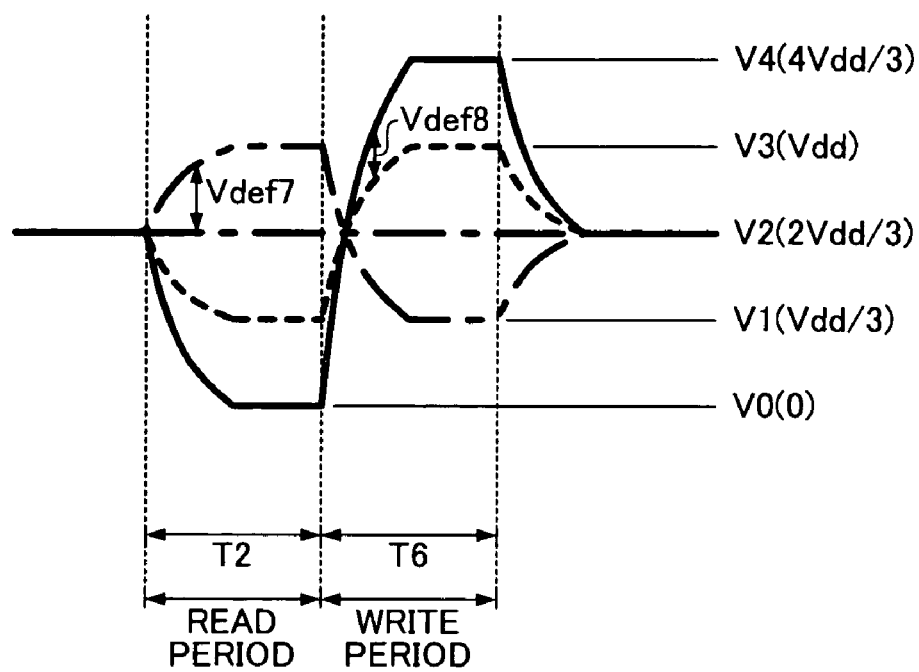
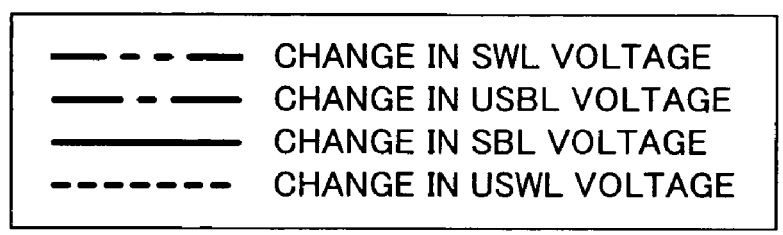

FERROELECTRIC MEMORY DEVICE

Japanese Patent Application No. 2003-7405 filed on Jan. 15, 2003 is hereby incorporated by reference in its entirety.

BACKGRAOUND OF THE INVENTION

The present invention relates to a ferroelectric memory device.

As a ferroelectric memory device, an active ferroelectric memory including 1T/1C cells in which one transistor and one capacitor (ferroelectric) are disposed in each cell, or including 2T/2C cells in which a reference cell is further disposed in each cell, has been known.

With this active type of ferroelectric memory device, however, the memory area is large in comparison with other known non-volatile memory devices in which memory cells are configured of single elements, such as flash memory or EEPROM, and it is not possible to increase the capacitance thereof.

One non-volatile memory device that can support an increased capacitance is a ferroelectric memory device in which each memory cell acts as a ferroelectric capacitor. (Refer to Japanese Patent Application Laid-Open No. 9-116107.)

BRIEF SUMMARY OF THE INVENTION

With a ferroelectric memory device in which each memory cell acts as a ferroelectric capacitor, some remaining technical problems need to be solved before it can be used in practice, such as the preservation of data in unselected memory cells and the implementation of faster drives, and the present invention was devised to solve those problems.

According to the present invention, there is provided a ferroelectric memory device comprising: a plurality of word lines disposed to be mutually parallel; a plurality of bit lines disposed to be mutually parallel, intersecting the word lines; a plurality of ferroelectric memory cells disposed at intersections of the word lines and the bit lines;

a word line drive section which drives the word lines; a bit line drive section which drives the bit lines; a selected-word-line-voltage-supply-line and an unselected-word-line-voltage-supply-line which are connected to the word line drive section; a selected-bit-line-voltage-supply-line and an unselected-bit-line-voltage-supply-line which are connected to the bit line drive section; a power circuit which generates a plurality of different voltages; a voltage selection circuit which selectively outputs the different voltages to the selected-word-line-voltage-supply-line, the unselected-word-line-voltage-supply-line, the selected-bit-line-voltage-supply-line, and the unselected-bit-line-voltage-supply-line; and a potential gradient correction section which reduces one of a first difference in potential gradient between the selected-word-line-voltage-supply-line and the unselected-bit-line-voltage-supply-line and a second difference in potential gradient between the selected-bit-line-voltage-supply-line and the unselected-word-line-voltage-supply-line. The word line drive section and the bit line drive section apply a positive or negative selection voltage to a selected memory cell from among the ferroelectric memory cells and an unselection voltage to the remaining unselected memory cells. When either the positive or the negative selection voltage is applied to the selected memory cell, the voltage selection circuit fixes the potential of the unselected-word-line-voltage-supply-line in a case where the potential gradient correction section reduces the first difference in potential gradient, and fixes the potential of the unselected-bit-line-voltage-supply-line in a case where the potential gradient correction section reduces the second difference in potential gradient.

With the present invention, the operation of the potential gradient correction section makes it possible to ensure that no excess voltage is applied to unselected memory cells, even during transition periods in which the selected-word-line-voltage, the unselected-word-line-voltage, the non-fixed-potential selected-bit-line-voltage, or the unselected-bit-line-voltage is switched. This makes it possible to prevent the application of an accidental over-voltage to an unselected memory cell, enabling preservation of data stored in that unselected memory cell. In addition, one of the unselected-word-line-voltage-supply-line and the unselected-bit-line-voltage-supply-line, which have a heavy connection load and slow charge/discharge speeds, is fixed to a single potential on the side at which the difference in potential gradient is not corrected. No potential gradient change occurs in the voltage supply line at the fixed potential, so no over-voltage is supplied to unselected memory cells due to a difference in potential gradient. In addition, the fixed potential makes it possible to improve the memory access speed.

The potential gradient correction section may set the magnitude of a voltage corresponding to one of the first and second differences in potential gradient which is to be reduced to be equal to or less than the magnitude of the unselection voltage. It is therefore possible to apply a voltage to each unselected memory cell that is equal to or less than the unselection voltage during a stable period in which the voltages reach to a predetermined value, even during transition periods during the switching of the voltages, making it possible to prevent deterioration of the data stored therein.

The potential gradient correction section may reduce the potential gradient of one of the selected-word-line-voltage-supply-line and the selected-bit-line-voltage-supply-line. As one example, the potential gradient correction section may increase an interconnect load of one of the selected-word-line-voltage-supply-line and the selected-bit-line-voltage-supply-line. In such a case, the potential gradient correction section could be configured of a resistor (R) and a capacitor (C), by way of example, to reduce the above-described potential gradient by increasing the interconnect load.

As another example, the potential gradient correction section may reduce the amount of current flowing per unit time in one of the selected-word-line-voltage-supply-line and the selected-bit-line-voltage-supply-line so as to close to the amount of current flowing per unit time in one of the unselected-word-line-voltage-supply-line and the unselected-bit-line-voltage-supply-line having an unfixed potential. In such a case, the potential gradient correction section can utilize the small current drive capability of a transistor. The potential gradient correction section could be configured by connecting a diode to that transistor.

The potential gradient correction section may increase the potential gradient of one of the unselected-word-line-voltage-supply-line and the unselected-bit-line-voltage-supply-line. In this case, the potential gradient correction section may increases the amount of current flowing per unit time in one of the unselected-word-line-voltage-supply-line and the unselected-bit-line-voltage-supply-line having an unfixed potential so as to close to the amount of current flowing per unit time, in one of the selected-word-line-voltage-supply-line and the selected-bit-line-voltage-supply-line. In such a case, in contrast to the above, the large current drive capability of a transistor can be utilized. This configuration enables a greater shortening of the access time.

The ferroelectric memory device in accordance with the present invention could be provided with a power circuit which generates a plurality of different voltages; and a voltage selection circuit which selectively outputs the different voltages to the word line drive section and the bit line drive section. The ferroelectric memory device may further comprise a control circuit which outputs to the voltage selection circuit a timing signal for switching the different voltages for output to the selected-word-line-voltage-supply-line, the selected-bit-line-voltage-supply-line, and one of the unselected-word-line-voltage-supply-line and the unselected-bit-line-voltage-supply-line having an unfixed potential.

The control circuit may output a signal for switching between the potential of the selected-bit-line-voltage-supply-line and the potential of one of the unselected-bit-line-voltage-supply-line and the unselected-word-line-voltage-supply-line having an unfixed voltage, substantially simultaneously with the timing at which the selected-word-line-voltage is supplied to the selected-word-line-voltage-supply-line. In such a case, the voltage selection circuit could supply the unselected-bit-line-voltage to the unselected-bit-line-voltage-supply-line substantially simultaneously with the timing at which the selected-word line-voltage is supplied to the selected-word-line-voltage-supply-line. The effect is to shorten the access time.

The control circuit may output a signal for switching between the potential of the selected-word-line-voltage-supply-line and the potential of one of the unselected-bit-line-voltage-supply-line and the unselected-word-line-voltage-supply-line having an unfixed potential, substantially simultaneously with the timing at which a selected-bit line-voltage is supplied to the selected-bit-line-voltage-supply-line. In such a case, the voltage selection circuit can supply the unselected-word line-voltage to the unselected-word-line-voltage-supply-line substantially simultaneously with the timing of the supply of the selected-bit line-voltage to the selected-bit-line-voltage-supply-line. This effect also shortens the access time.

The power circuit may generate five different voltages having the relationship V0<V1<V2<V3<V4. In this case, the voltage selection circuit may fix the voltage of the unselected-word-line-voltage-supply-line at the voltage V2, as one example. The voltage selection circuit may operate to supply the voltage V4 to the selected-word-line-voltage-supply-line, the voltage V3 to the unselected-bit-line-voltage-supply-line, and the voltage V1 to the selected-bit-line-voltage-supply-line when the positive selection voltage is applied to the selected memory cell. The voltage selection circuit may operate to supply the voltage V0 to the selected-word-line-voltage-supply-line, the voltage V1 to the unselected-bit-line-voltage-supply-line, and the voltage V3 to the selected-bit-line-voltage-supply-line when the negative selection voltage is applied to the selected memory cell.

In this case, the control circuit may output a signal for switching the voltage V4 of the selected-word-line-voltage-supply-line to the voltage V2, after the positive selection voltage is applied to the selected memory cell. Then, the control circuit may output signals for substantially simultaneously switching the voltage V2 of the selected-word-line-voltage-supply-line to the voltage V0, the voltage V3 of the unselected-bit-line-voltage-supply-line to the voltage V1, and the voltage V1 of the selected-bit-line-voltage-supply-line to the voltage V2.

As another example, the voltage selection circuit may fix the unselected-bit-line-voltage-supply-line to the voltage V2, instead of the unselected-word-line-voltage-supply-line. In this case, the voltage selection circuit may operate to supply the voltage V3 to the selected-word-line-voltage-supply-line, the voltage V1 to the unselected-word-line-voltage-supply-line, and the voltage V0 to the selected-bit-line-voltage-supply-line when the positive selection voltage is applied to the selected memory cell. The voltage selection circuit may operate to supply the voltage V1 to the selected-word-line-voltage-supply-line, the voltage V3 to the unselected-word-line-voltage-supply-line, and the voltage V4 to the selected-bit-line-voltage-supply-line when the negative selection voltage is applied to the selected memory cell.

The control circuit may output a signal for switching the voltage V3 of the selected-word-line-voltage-supply-line to the voltage V1, after the positive selection voltage is applied to the selected memory cell. Then, the control circuit may output signals for substantially simultaneously switching the voltage V1 of the unselected-world-line-voltage-supply-line to the voltage V3, and the voltage V0 of the selected-bit-line-voltage-supply-line to the voltage V2.

BRIEF DESCRIPTION OF THE SEVERAL VIEWS OF THE DRAWING

FIG. 34 shows the four different waveforms of FIG. 33 superimposed.

DETAILED DESCRIPTION OF THE EMBODIMENT

Embodiments of the present invention are described below with reference to the accompanying figures.

First Embodiment

A first embodiment is described below with reference to the accompanying figures.

Basic Configuration of Ferroelectric Memory Device

Figure 1:
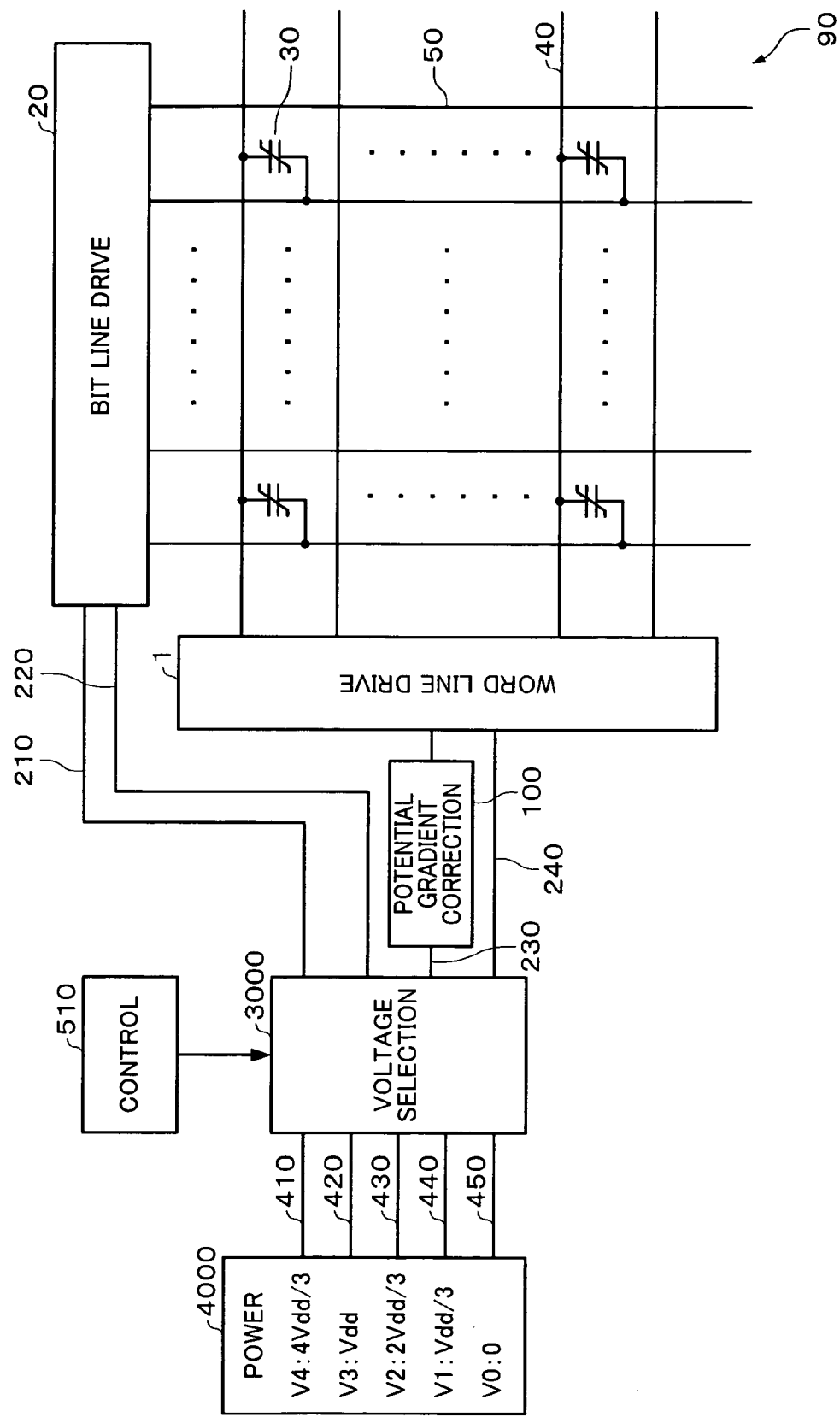
FIG. 1 is a block diagram of a ferroelectric memory device in accordance with a first embodiment.

The entirety of a ferroelectric memory device in accordance with an embodiment of the present invention is shown in FIG. 1.

The ferroelectric memory device of FIG. 1 is configured of a plurality of ferroelectric capacitors (memory cells) 30 disposed at the intersections of a plurality of word lines 40 and a plurality of bit lines 50 that are arranged in a matrix. One word line 40 and one bit line 50 can be selected in order to select a specific memory cell 30 from the plurality of memory cells 30.

In a computer, one bit can be considered to be a quantity that enables the representation of two states, and a ferroelectric memory device is a memory device that utilizes two states expressed by the hysteresis phenomenon in the ferroelectric capacitor 30 as one bit.

Figure 2:
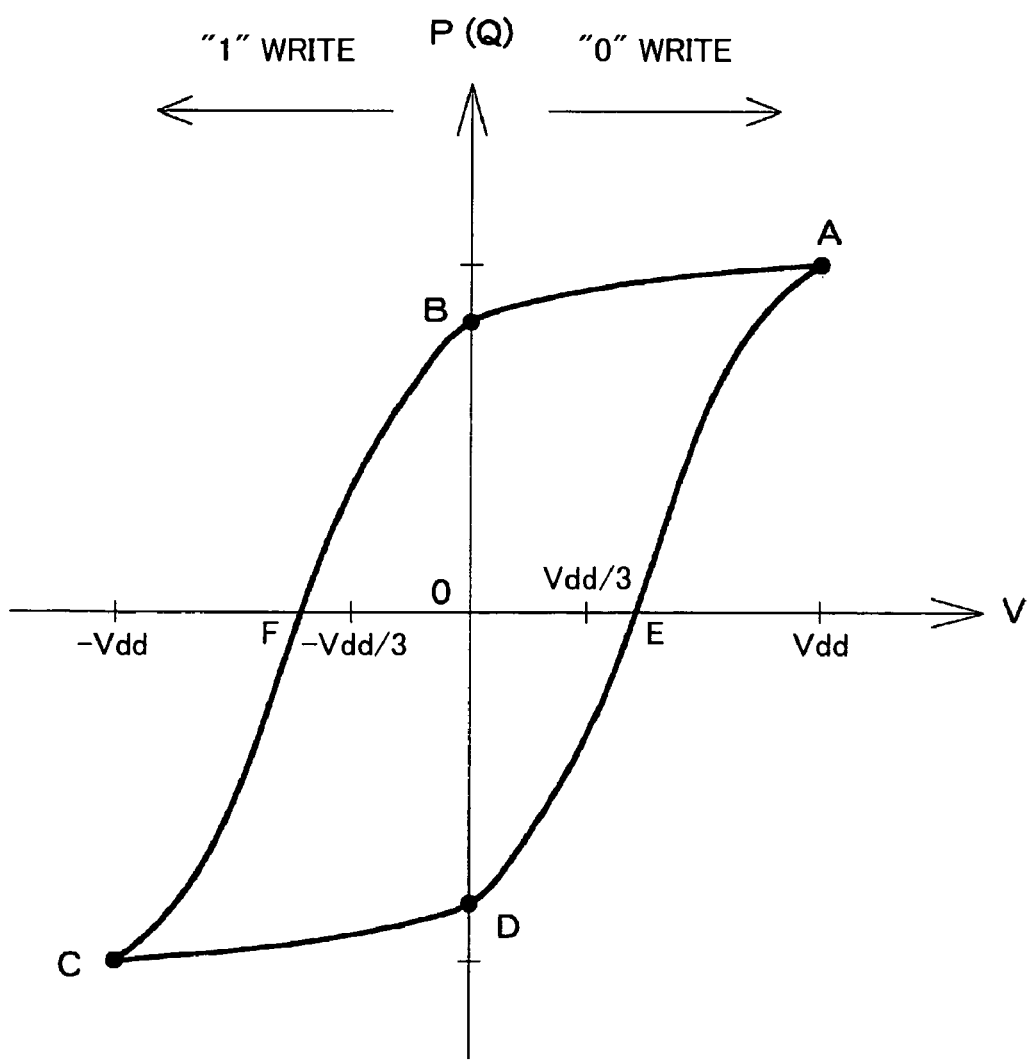
FIG. 2 illustrates a hysteresis phenomenon of ferroelectrics.

In the hysteresis phenomenon, the relationship between a voltage applied to the ferroelectric element and the polarization value of the ferroelectric element is as shown in FIG. 2. In FIG. 2, the polarization value (amount of charge) is plotted along the vertical axis P(Q) and the voltage applied to the ferroelectric element is plotted along the horizontal axis V. The curves in FIG. 2 show the characteristic of a cycle of changes in the polarized state of the ferroelectric capacitor 30 corresponding to changes in the voltage applied to the ferroelectric capacitor 30. If, for example, a positive selection voltage Vdd is applied to the ferroelectric capacitor 30 that is either in a state at a point B (memory state for logic value 0) or a point D (memory state for a logic value 1), the polarized state move to a point A (read-out of logic value 0 or 1). If the applied voltage goes to 0, the curve moves to point B. In other words, it moves to point B through point A, even if the polarized state was originally at point D. If a negative selection voltage (−Vdd) is subsequently applied to the ferroelectric capacitor 30, the characteristic move to a point C (writing of logic level 1). If the applied voltage goes to zero, the logic this time returns to point D (memory state for logic value 1).

In this case, assume that an unselection voltage (±Vdd/3) is applied to the ferroelectric capacitor 30 in the polarized state at point B or point D. If the applied voltage subsequently goes to zero, the state will return to the original point B or point D. This shows that when a certain ferroelectric capacitor 30 is selected, the memory state is retained even when an unselection voltage (±Vdd/3) is applied to an unselected ferroelectric capacitor 30.

The description now turns to the writing of data to the ferroelectric memory device. First of all, a data write requires the writing of "0" data and the writing of "1" data. Since it is necessary to reverse the direction of application of the voltage for the writing of "0" data and the writing of "1" data, due to the characteristics of the ferroelectric capacitor 30, it is necessary to perform the "0" data write and the "1" data write in two steps.

Since this ferroelectric memory device uses a destructive read method, a rewriting operation is necessary after the read. Thus data reading requires the two steps of reading and rewriting. The initial read step reads out the held state from the amount of charge that moves within the ferroelectric capacitor 30, by applying a voltage in the same direction as a "0" data write. The subsequent rewrite writes the "1" data back into those cells that originally held "1" data.

From the above, it is clear that it is necessary to have both a "0" data write and a "1" data write for each of data read and data write.

In this document, "0" data write is defined as "read" and "1" data write is defined as "write".

Since read and write are implemented by controlling the voltage that is applied to the memory cell 30 that uses a ferroelectric capacitor, and the direction it is applied in, it enables the ferroelectric memory device to operate as a memory device.

Configuration of Peripheral Circuits of Memory Cell Array

FIG. 1 is a block diagram of the ferroelectric memory device of this embodiment.

A power circuit 4000 of FIG. 1 generates five different voltages V0 to V4 (V4=4Vdd/3, V3=Vdd, V2=2Vdd/3, V1=Vdd/3, and V0=0), where the voltage V4 (4Vdd/3) is extra to the four different voltages used by an ordinary ⅓ bias drive method. In this embodiment, the voltage V4 (4Vdd/3) is created by amplifying the power voltage Vdd, but it is not limited thereto. The power circuit 4000 is also provided with voltage output lines 410 to 450 for outputting the five different voltages V0 to V4 to a voltage selection circuit 3000.

Figure 3:
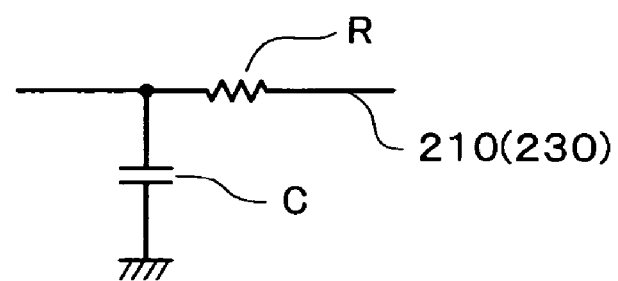
FIG. 3 is a circuit diagram of an example of a potential gradient correction section.
Figure 4:
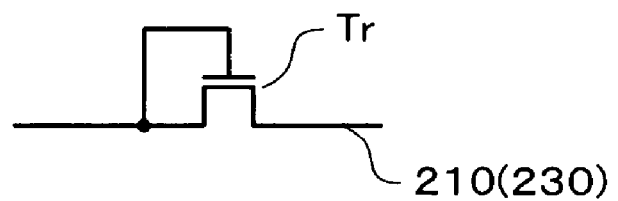
FIG. 4 is a circuit diagram of an example of a potential gradient correction section.

A selected-bit-line-voltage-supply-line 210 and an unselected-bit-line-voltage-supply-line 220 are connected to a bit line drive section 20 and the voltage selection circuit 3000. A selected-word-line-voltage-supply-line 230 and an unselected-word-line-voltage-supply-line 240 are connected to a word line drive section 1 and the voltage selection circuit 3000. A potential gradient correction section 100 is provided in the selected-word-line-voltage-supply-line 230. In this embodiment, the potential gradient correction section 100 moderates the output of the potential gradient of the selected-word-line-voltage-supply-line 230, in other words, the gradient at which the potential rises and falls. With the potential gradient correction section 100 shown in FIG. 3, by way of example, gradient of the rise and fall in potential is indicated gently by deliberately increasing the interconnect load, using a capacitance (C) and a resistor (R). Alternatively, if the potential gradient correction section 100 is as shown in FIG. 4, the small current supply capability of a transistor TR is utilized to reduce the amount of current per unit time, based on the applied voltage, enabling moderation of the gradient of current changes during the charging of the selected-word-line-voltage-supply-line 230.

The voltage selection circuit 3000 selects three voltages chosen from among the five voltages V0 to V4, in accordance with a signal from a control circuit 510; outputs them to the select bit voltage supply line 210, the unselected-bit-line-voltage-supply-line 220, and the selected-word-line-voltage-supply-line 230; and also outputs a fixed voltage V2 (2Vdd/3) to the unselected-word-line-voltage-supply-line 240.

The word line drive section 1 and the bit line drive section 20 switch the voltage supply lines 210 to 240 connected to the plurality of memory cells 30, and connect them to the word lines 40 and the bit lines 50.

Reading and Writing

The description now turns to the operation of reading (writing a "0") and writing (writing a "1"). The voltages applied to the memory cell 30 during a read are as shown in FIG. 5 and those applied to the memory cell 30 during a write are as shown in FIG. 6.

Figure 5:
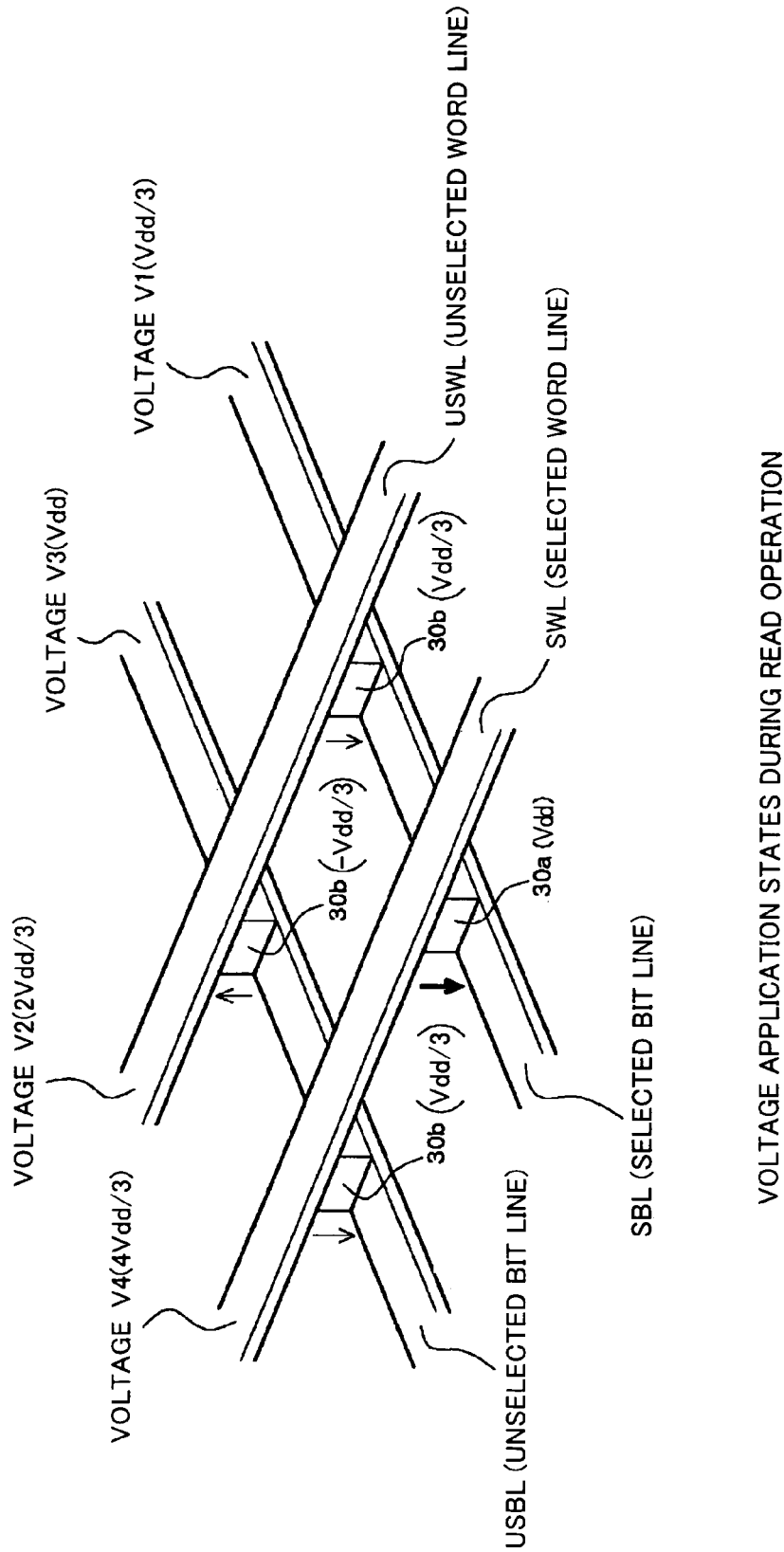
FIG. 5 shows voltage application states during a read operation of the ferroelectric memory device of the first embodiment.
Figure 6:
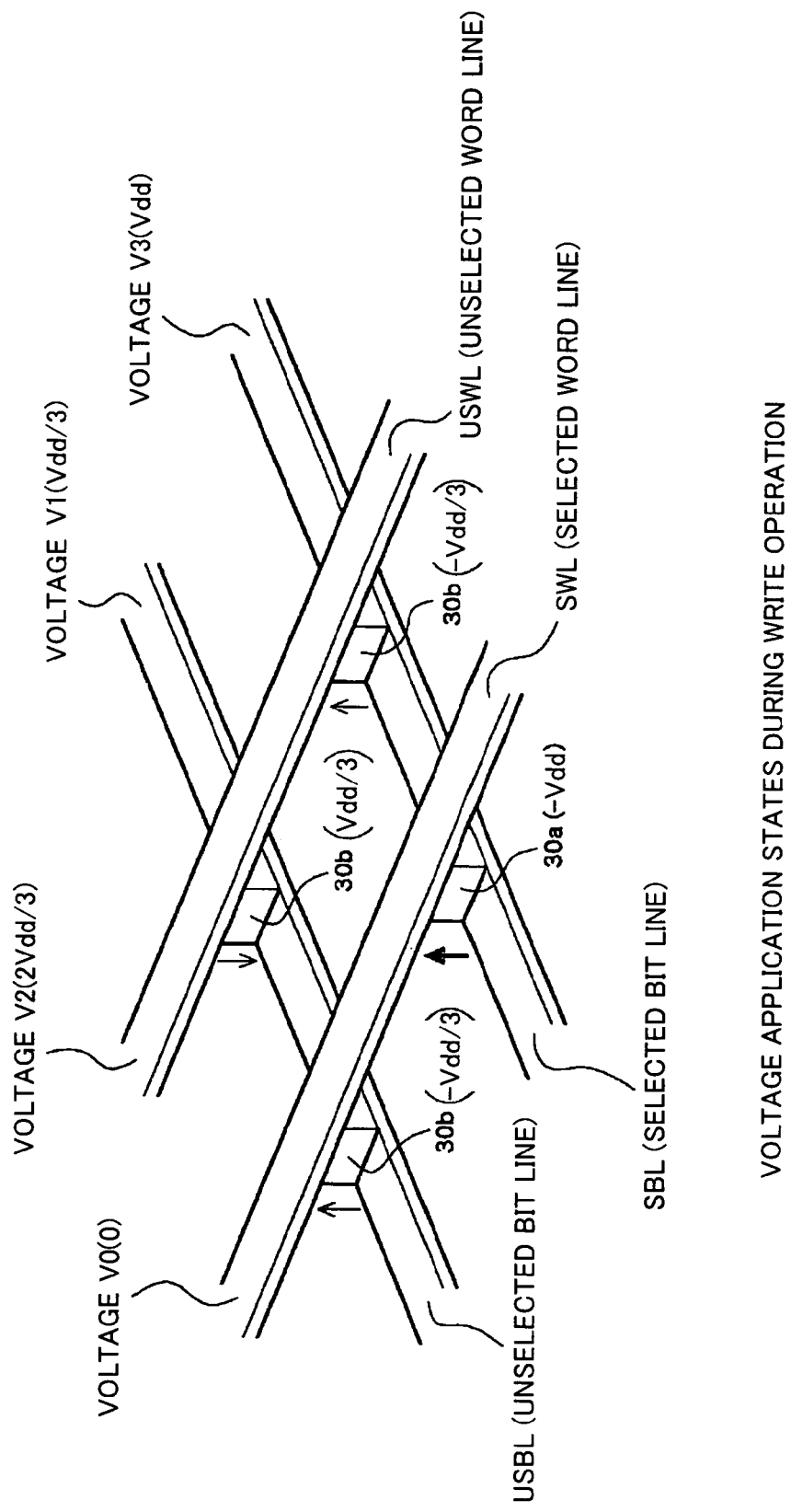
FIG. 6 shows voltage application states during a write operation of the ferroelectric memory device of the first embodiment.

A selected memory cell 30a shown in FIGS. 5 and 6 is the memory cell 30 that is being subjected to reading or writing. SBL in FIGS. 5 and 6 denotes a selected bit line SBL, USBL denotes an unselected bit line USBL, SWL denotes a selected word line SWL, and USWL denotes an unselected word line USWL. In all the figures, the reference designations SBL, USBL, SWL, and USWL have the same meanings in the descriptions below.

During the read of FIG. 5, the voltage V4 (4Vdd/3) from the select word voltage supply line 230 and the voltage V1 (Vdd/3) from the select bit voltage supply line 210 are supplied to the selected memory cell 30a, so that a positive selection voltage (Vdd) is applied thereto. This implements the writing of "0" as shown in FIG. 2, to cause the reading of data.

During the write of FIG. 6, the voltage V0 (0V) of the select word voltage supply line 230 and the voltage V3 (Vdd) from the select bit voltage supply line 210 are supplied to the selected memory cell 30a, so that a negative selection voltage (−Vdd) is applied thereto. This implements the writing of "1" as shown in FIG. 2, to cause the writing of data.

Unselected memory cells 30b in FIGS. 5 and 6 represent the remaining plurality of memory cells that are not subjected to the reading and writing. In each of FIGS. 5 and 6, an unselection voltage (±Vdd/3) is applied to each unselected memory cell 30b.

Attention should be drawn in this case to the fact that the voltage of the unselected word line USWL of this embodiment is fixed to the voltage V2 (2Vdd/3) during either the reading of FIG. 5 or the writing of FIG. 6 that is implemented subsequently thereto. This enables the fixing of the voltage of the unselected-word-line-voltage-supply-line 240 that is connected to the unselected word line USWL, over the period from the read to the write.

Operation of Potential Change Gradient Correction Section

The reason for the provision of the potential gradient correction section 100 of this embodiment is discussed below. The loads on the selected-bit-line-voltage-supply-line 210 and the selected-word-line-voltage-supply-line 230 are much lower than the loads on the unselected-bit-line-voltage-supply-line 220 and the unselected-word-line-voltage-supply-line 240. For that reason, the potential gradients of the selected-bit-line-voltage-supply-line 210 and the selected-word-line-voltage-supply-line 230 are much steeper than the potential gradients of the unselected-bit-line-voltage-supply-line 220 and the unselected-word-line-voltage-supply-line 240. The potential gradient correction section 100 is provided to reduce these differences in potential gradient in the voltage supply lines 210 to 240.

More specifically, the numbers of selected word lines SWL and selected bit lines SBL connected to the selected-bit-line-voltage-supply-line 210 and the selected-word-line-voltage-supply-line 230 are small in comparison to the number of selected memory cells 30a connected thereto. In contrast thereto, the numbers of unselected word lines USWL and unselected bit lines USBL connected to the unselected-bit-line-voltage-supply-line 220 and the unselected-word-line-voltage-supply-line 240 and the numbers of unselected memory cells 30b are overwhelmingly large. Thus the loads connected to the unselected-bit-line-voltage-supply-line 220 and the unselected-word-line-voltage-supply-line 240 are large, moderating the gradients at which the potentials of the unselected word line USWL and the unselected bit line USBL rise and fall.

Figure 7:
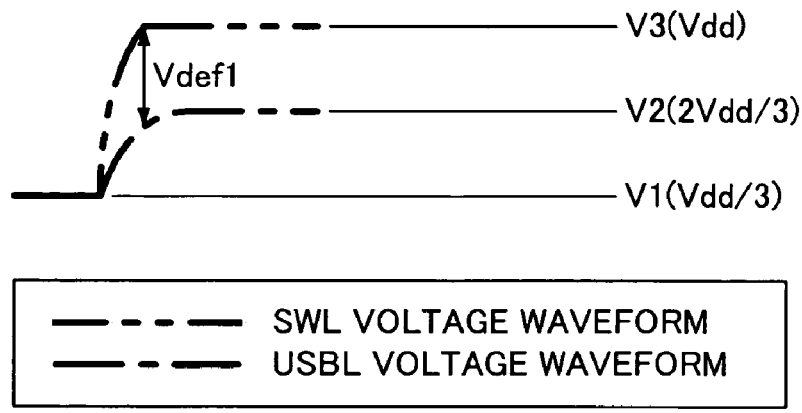
FIG. 7 compares the gradients of voltage rises in a selected word line and an unselected bit line in accordance with the first embodiment.
Figure 8:
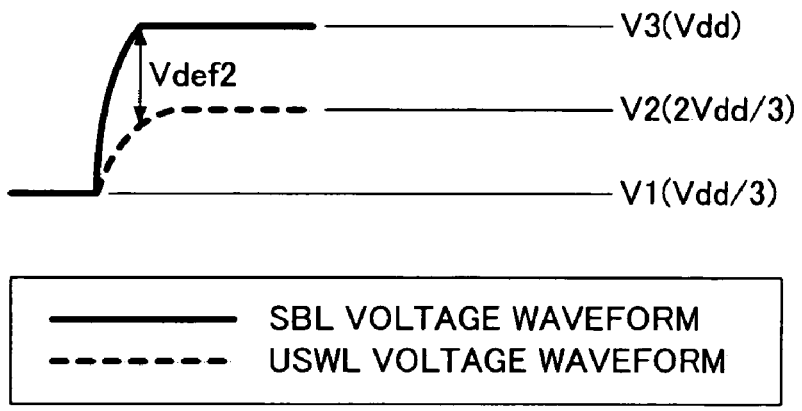
FIG. 8 compares the gradients of voltage rises in a selected bit line and a unselected word line.

The discussion now turns to a problem that occurs in a comparative example in which no potential gradient correction section 100 is provided, with reference to FIGS. 7 and 8. The application of voltages to the selected word line SWL and the unselected bit line USBL at the same timing during a read period is shown by way of example in FIG. 7. As can be seen from FIG. 7, a voltage difference Vdef1 between the selected word line SWL and the unselected bit line USBL temporarily exceeds the unselection voltage (Vdd/3). Similarly, the application of voltages to the selected bit line SBL and the unselected word line USWL at the same timing during a write period is shown by way of example in FIG. 8. As can be seen from FIG. 8, a voltage difference Vdef2 between the selected bit line SBL and the unselected word line USWL temporarily exceeds the unselection voltage. The discrepancy in the rising gradients of the voltages is caused by discrepancies in wiring capacitances.

In FIGS. 7 and 8, a voltage that exceeds the unselection voltage is applied to each unselected memory cell during the change in potential. The application of an over-voltage to this unselected memory cell promotes disruption of the stored data and thus is not preferred.

Since this embodiment of the invention is provided with the potential gradient correction section 100, it is possible to avoid the problem that occurs in the above-described comparative example. In other words, the voltage difference between the selected word line SWL and the unselected bit line USBL does not exceed the unselection voltage (Vdd/3), even when voltages are applied at the same timing to the selected word line SWL and the unselected bit line USBL, by way of example.

Figure 9:
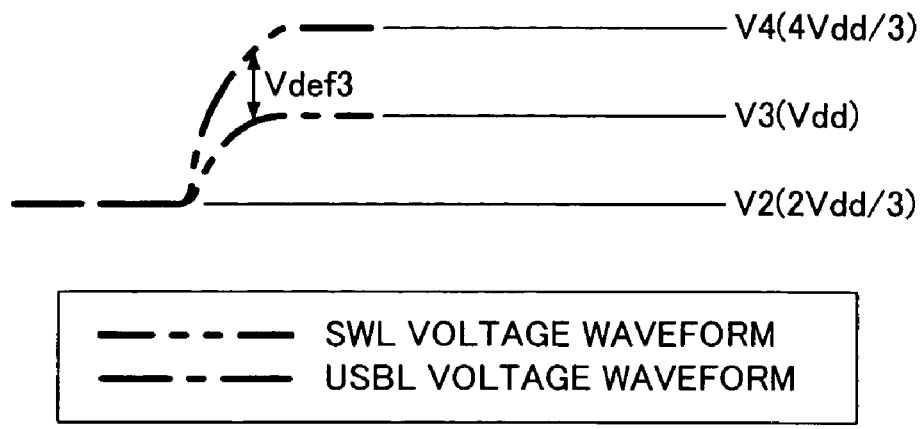
FIG. 9 compares the gradients of voltage rises in a selected word line and an unselected bit line in accordance with a comparative example.
Figure 10:
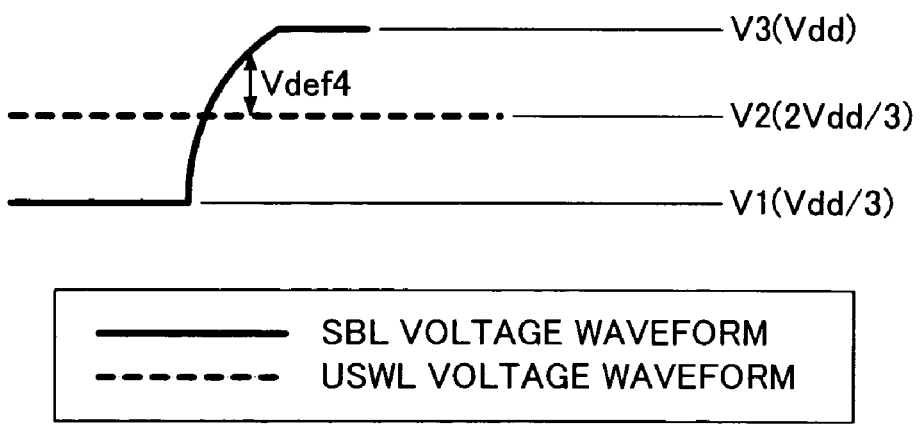
FIG. 10 compares the gradients of voltage rises in an unselected word line and a selected bit line.

The description now turns to the operation of the potential gradient correction section 100 during reading and writing. A waveform chart illustrating the changes in voltage of the selected word line SWL and the unselected bit line USBL during a read in accordance with this embodiment is shown in FIG. 9. It can be seen from FIG. 9 that a voltage difference Vdef3 between the selected word line SWL and the unselected bit line USBL does not exceed the unselection voltage (Vdd/3). The potential gradient correction section 100 operates on the selected word line SWL that originally had a small interconnect load, moderating the rise in voltage of the selected word line SWL. A waveform chart illustrating the changes in voltage of the selected bit line SBL and the unselected word line USWL during a write in accordance with this embodiment is shown in FIG. 10. A voltage difference Vdef4 between the selected bit line SBL and the unselected word line USWL does not exceed the unselection voltage (Vdd/3) because the unselected word line USWL is at a fixed potential. In other words, the potential gradient correction section 100 is not provided for the selected-word-line-voltage-supply-line 230 alone of this embodiment.

Control Circuit and Voltage Selection Circuit

Figure 11:
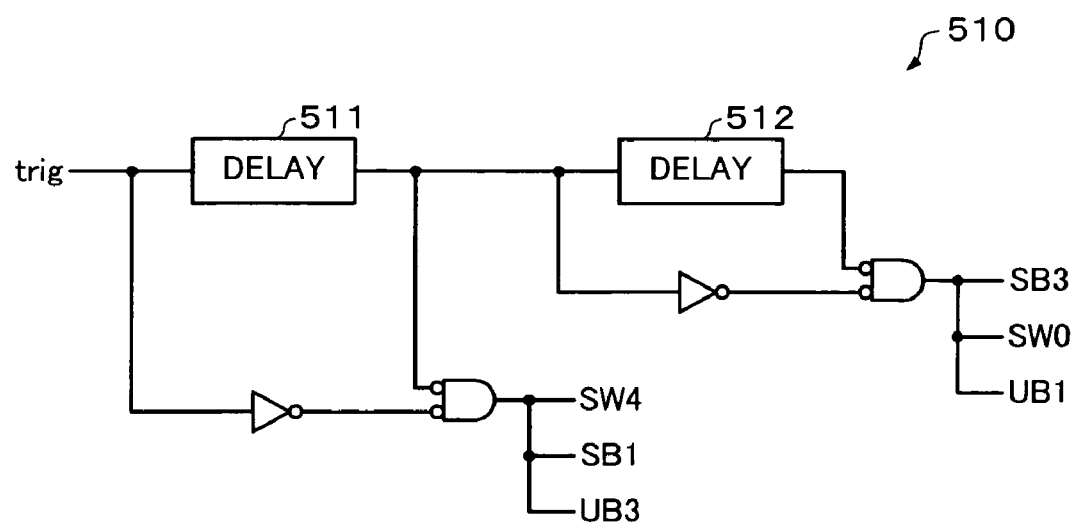
FIG. 11 shows a control circuit of the first embodiment.
Figure 12:
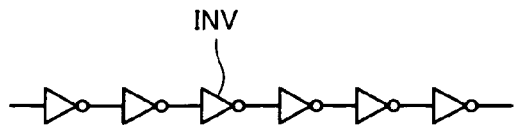
FIG. 12 shows the configuration of delay circuits.

An example of a logic circuit diagram for the control circuit 510 is shown in FIG. 11. The control circuit 510 comprises two delay circuits 511 and 512. Each of the delay circuits 511 and 512 is configured of a plurality of inverters INV, as shown in FIG. 12, in order to create constant delay times T1 and T2 shown in FIG. 17.

If a trig signal that is output when a selected memory cell is accessed is input to the control circuit 510 of FIG. 11, the operation of the delay circuits 511 and 512 ensures that signals SW4, SB1, UB3, SB3, SW0, and UB1 that control the output voltages of the voltage supply lines 210 to 240 are sequentially transmitted to the voltage selection circuit 3000. The voltage selection circuit 3000 determines the voltages to output to the voltage supply lines 210 to 240, based on the received signals. A switching circuit for processing the received signals is also provided for each of the voltage supply lines 210 to 240 in the voltage selection circuit 3000. The thus-provided switching circuits are shown in FIGS. 13, 14, and 15.

Figure 13:
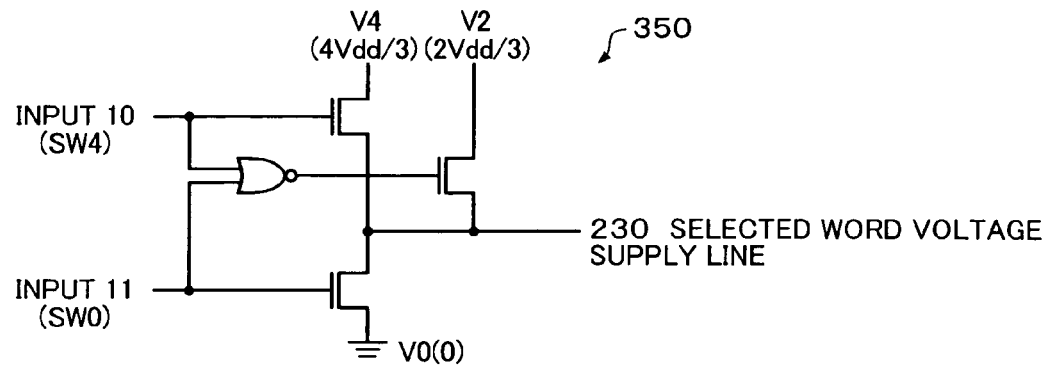
FIG. 13 shows a power switching circuit.
Figure 15:
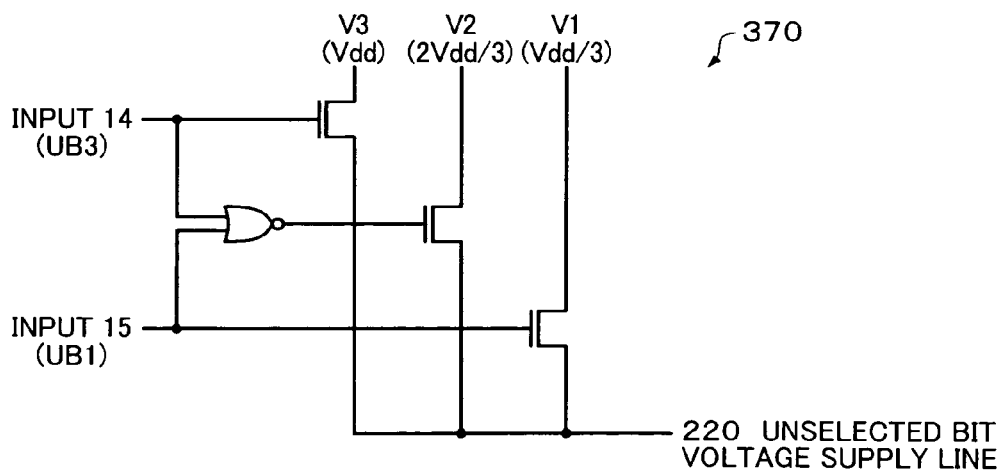
FIG. 15 shows a power switching circuit.
Figure 16:
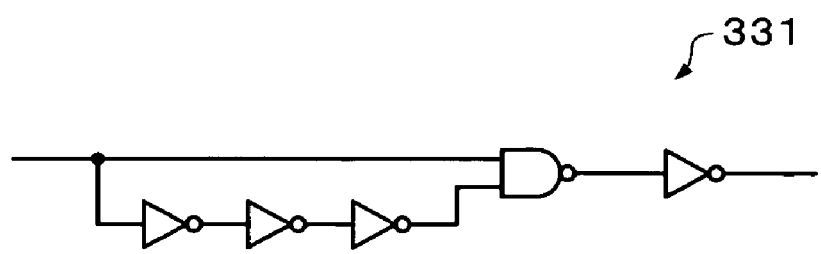
FIG. 16 shows a pulse circuit used in the power switching circuit.

A power switching circuit 350 shown in FIG. 13 is provided for the selected-word-line-voltage-supply-line 230. A power switching circuit 360 shown in FIG. 14 is provided for the unselected-bit-line-voltage-supply-line 220. A power switching circuit 370 shown in FIG. 15 is provided for the unselected-bit-line-voltage-supply-line 220. This embodiment is characterized in that the unselected-word-line-voltage-supply-line 240 does not require a power switching circuit because a constant voltage is supplied thereto. Note that an equivalent circuit of a pulse circuit 331 of FIG. 14 is shown in FIG. 16.

When the signal SW4 of FIG. 11 is input to an input 10 of FIG. 13, the voltage V4 (4Vdd/3) is output to the selected-word-line-voltage-supply-line 230. Similarly, when the signal SW0 of FIG. 11 is input to an input 11 of FIG. 13, the voltage V0 (0) is output to the selected-word-line-voltage-supply-line 230. If no signals are input to the inputs 10 and 11 of FIG. 13, the voltage V2 (2Vdd/3) is output to the selected-word-line-voltage-supply-linevoltage-supply-line 230.

Figure 14:
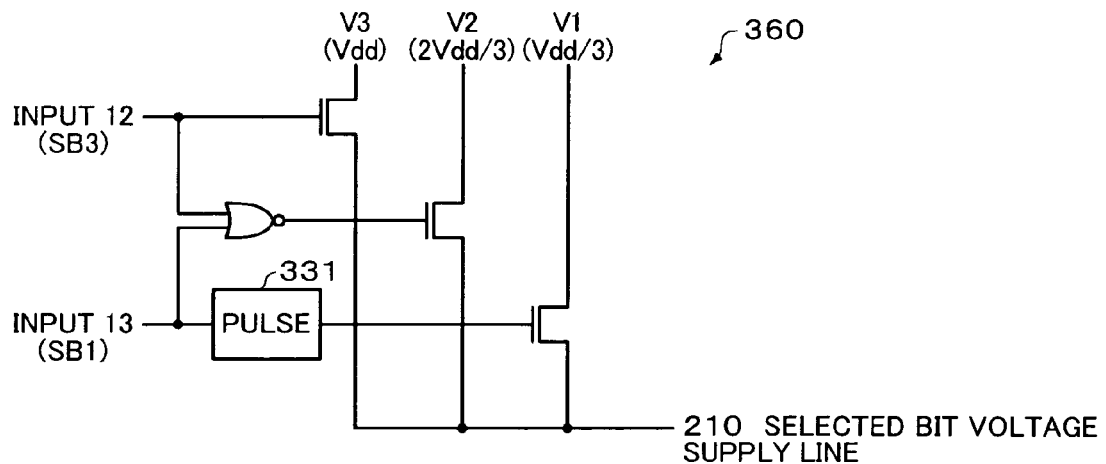
FIG. 14 shows a power switching circuit.

When a signal SB3 of FIG. 11 is input to an input 12 of FIG. 14, the voltage V3 (Vdd) is output to the selected-bit-line-voltage-supply-line 210. Similarly, when the signal SB1 of FIG. 11 is input to an input 13 of FIG. 14, the voltage V1 (Vdd/3) is temporarily output to the selected-bit-line-voltage-supply-line 210. If no signals are input to the inputs 12 and 13 of FIG. 14, the voltage V2 (2Vdd/3) is output to the selected-bit-line-voltage-supply-line 210.

When the signal UB3 of FIG. 11 is input to an input 14 of FIG. 15, the voltage V3 (Vdd) is output to the unselected-bit-line-voltage-supply-line 220. Similarly, when the signal UB1 of FIG. 11 is input to an input 15 of FIG. 15, the voltage V1 (Vdd/3) is output to the unselected-bit-line-voltage-supply-line 220. If no signals are input to the inputs 14 and 15 of FIG. 15, the voltage V2 (2Vdd/3) is output to the unselected-bit-line-voltage-supply-line 220.

Figure 17:
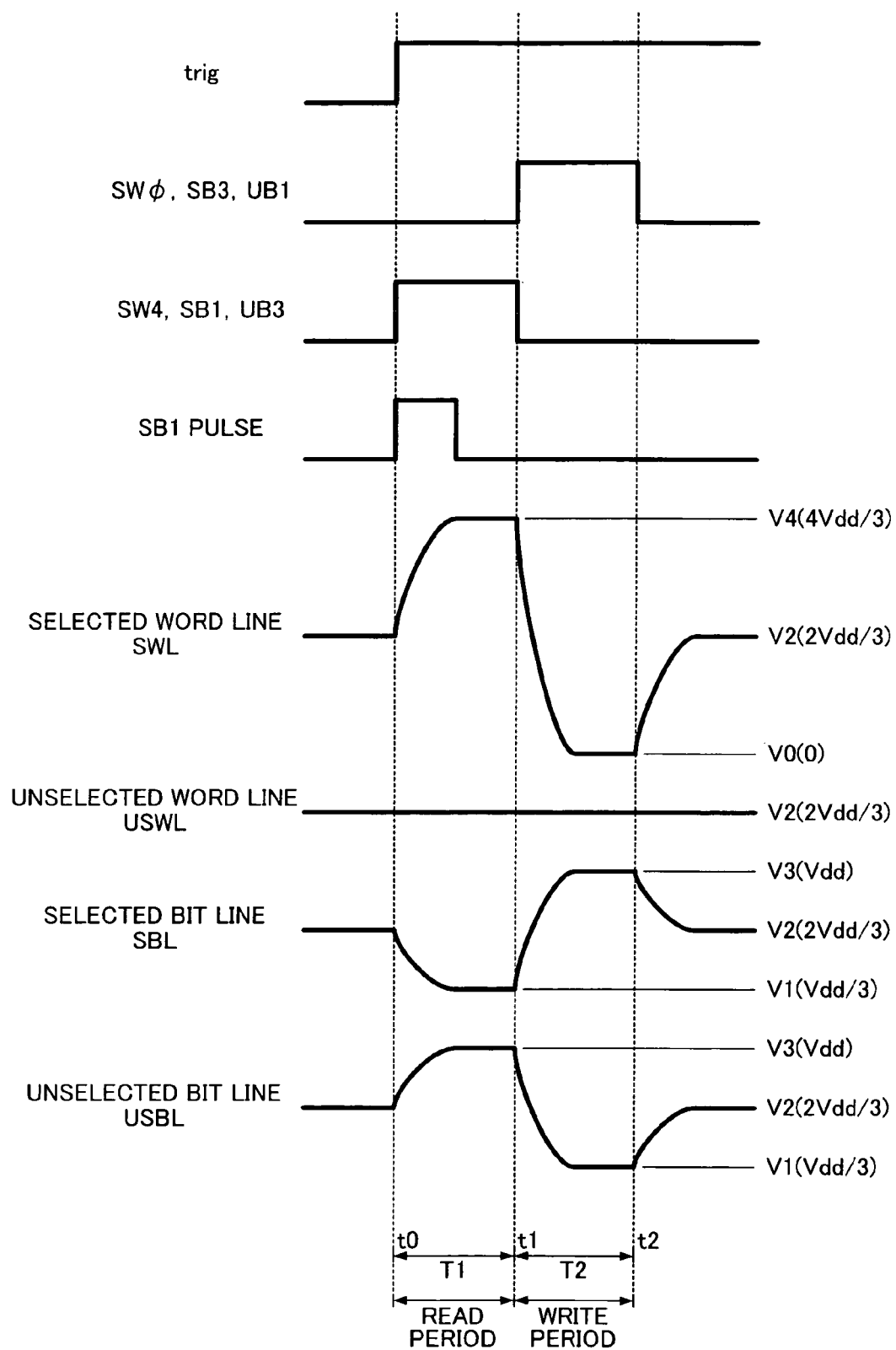
FIG. 17 is a timing chart illustrating an operation of the first embodiment.

A timing chart of the signals (SW4, SW0, SB3, SB1, UB3, and UB1) that are output from the control circuit 510 of FIG. 11 and the voltages that are output to the voltage supply lines 210 to 240 of the voltage selection circuit 3000 are shown in FIG. 17, simultaneously. In FIG. 17, t0 to t2 denote timings.

As can be seen from FIG. 17, if the trig signal is input to the control circuit 510 of FIG. 11 at the timing t0, the signals SW4, SB1, and UB3 rise simultaneously. At that time, the voltage V1 (Vdd/3) is supplied through the selected-bit-line-voltage-supply-line 210 to the selected bit line SBL and the voltage V3 (Vdd) is supplied through the unselected-bit-line-voltage-supply-line 220 to the unselected bit line USBL. In addition, the voltage V4 (4Vdd/3) is supplied through the selected-word-line-voltage-supply-line 230 to the selected word line SWL.

The signal SW4 then falls at the timing t1, and the voltage V2 (2Vdd/3) is supplied through the selected-word-line-voltage-supply-line 230 to the selected word line SWL simultaneously with a state at which no signals are being input to the power switching circuit 350. A positive selection voltage (Vdd) is applied to the selected memory cell 30a of FIG. 5 during a time interval T1 between timings t0 and t1, to implement a read (writing of a "0"). The period T1 between the timing t0 and the timing t1 represents a read period.

The period of the subsequent time interval T2 is characterized by a voltage change. At the timing t1, the signals SW4, SB1, and UB3 fall, and the signals SW0, SB3, and UB1 rise simultaneously therewith. At that point, the voltage V0 (0) is supplied through the selected-word-line-voltage-supply-line 230 to the selected word line SWL, the voltage V3 (Vdd) is supplied through the selected-bit-line-voltage-supply-line 210 to the selected bit line SBL, and the voltage V1 (Vdd/3) is supplied through the unselected-bit-line-voltage-supply-line 220 to the unselected bit line USBL.

In this manner, this embodiment implements falls in the voltages of the selected word line SWL and the unselected bit line USBL and a rise in the voltage of the selected bit line SBL during the period of a time interval T2, as shown in FIG. 17.

The signals SW0, SB3, and UB1 then fall at the timing t2. This causes the supply of the voltage V2 (2Vdd/3) to the selected word line SWL, the selected bit line SBL, and the unselected bit line USBL. The period T2 between the timing t1 and the timing t2 represents a write period.

Comparison between this Embodiment and Comparative Example

In order to discuss the effects of this embodiment, the description first concerns a comparative example.

Figure 18:
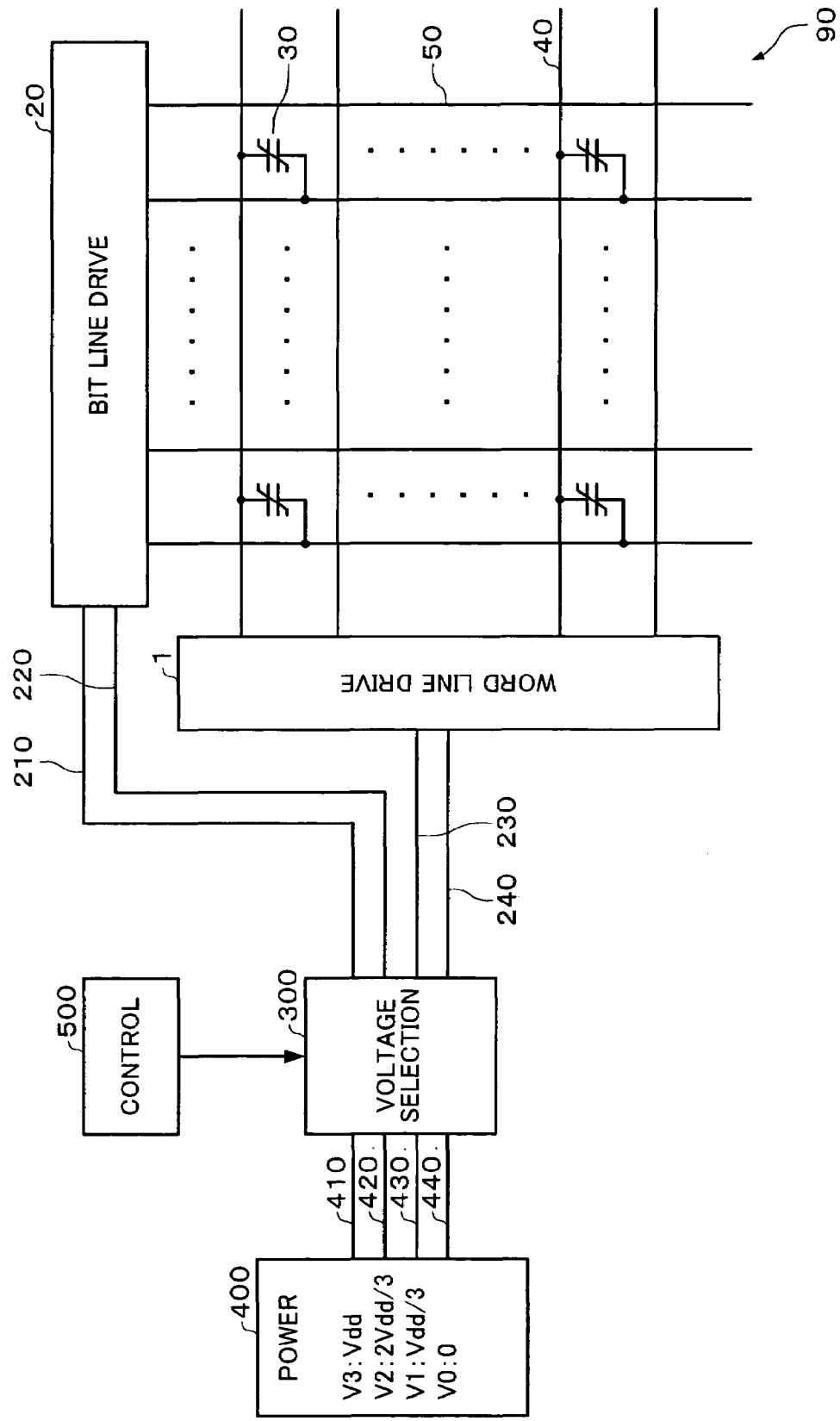
FIG. 18 is a block diagram of a ferroelectric memory device of a comparative example.

A block diagram of the comparative example is shown in FIG. 18. A memory cell array 90 of FIG. 18 is similar to that of this embodiment, shown in FIG. 1, Instead of the power circuit 4000 of this embodiment, a power circuit 400 is used in the comparative example. The power circuit 400 of FIG. 18 generates four different voltages (Vdd, 2Vdd/3, Vdd/3, and 0). The power circuit 400 is also provided with the voltage output lines 410 to 440 for outputting the plurality of voltages to the voltage selection circuit 300.

The voltage selection circuit 300 selects the plurality of voltages that are output from the power circuit 400 and outputs them to the voltage supply lines 210 to 240. The potential gradient correction section 100 is provided in the selected-word-line-voltage-supply-line 230 in accordance with this embodiment, but it is not provided in the comparative example.

Figure 19:
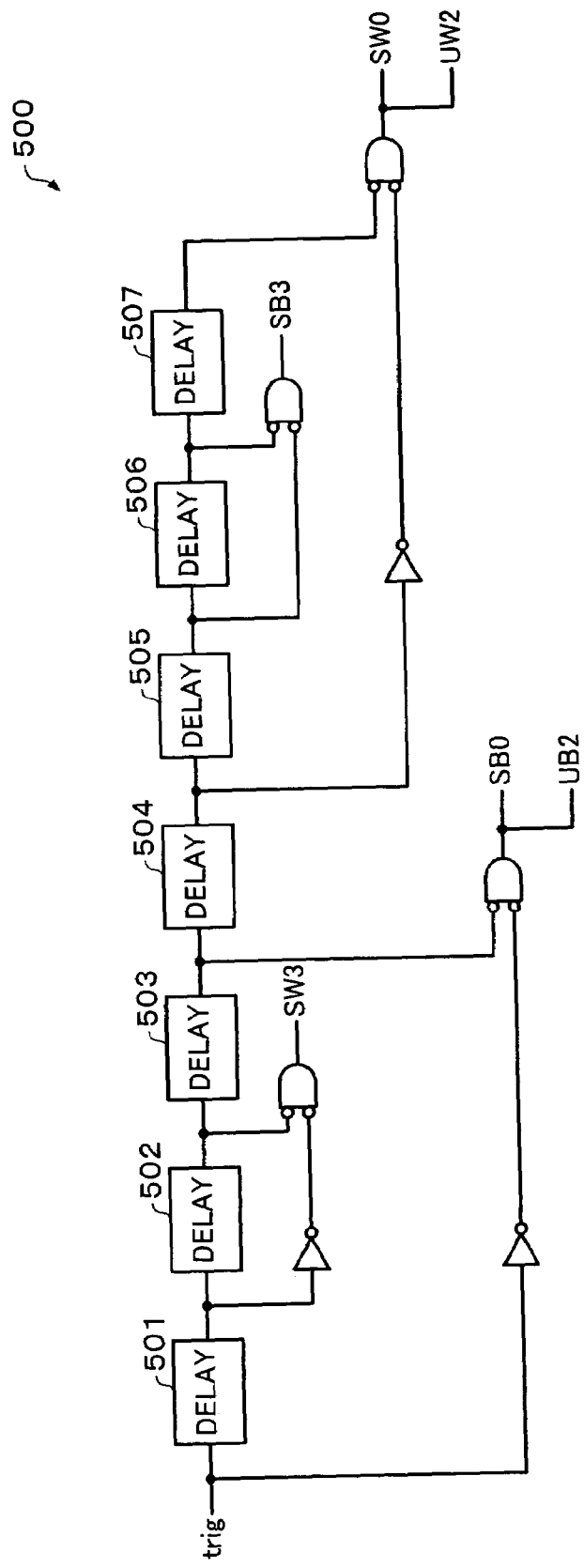
FIG. 19 shows a control circuit of the comparative example.
Figure 20:
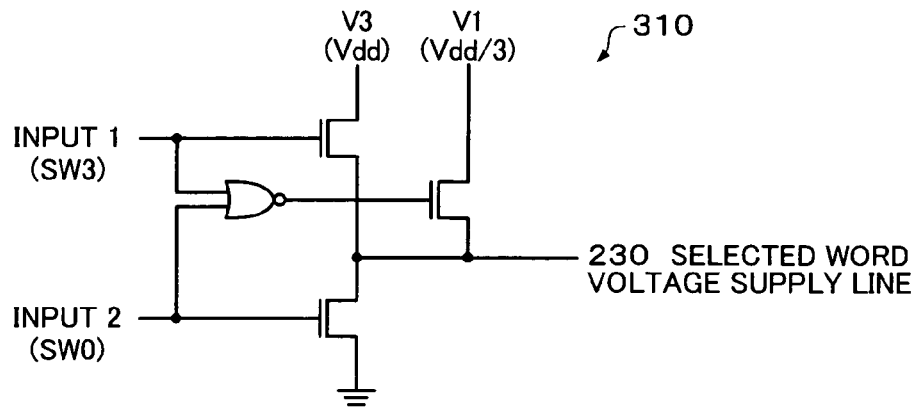
FIG. 20 shows a power switching circuit.
Figure 21:
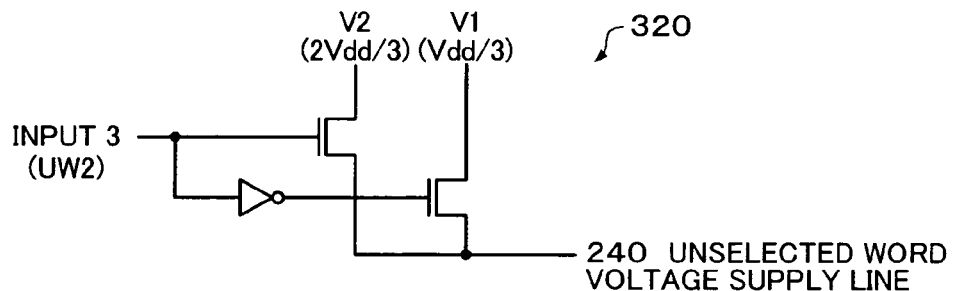
FIG. 21 shows a power switching circuit.
Figure 22:
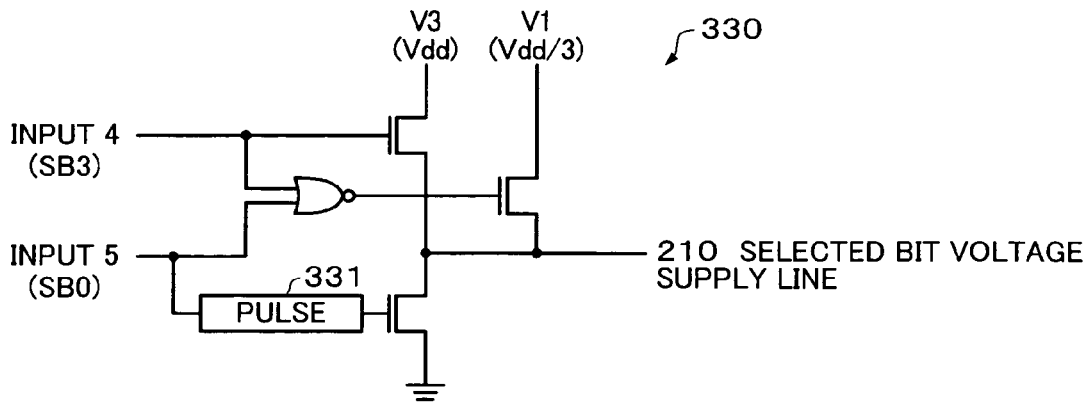
FIG. 22 shows a power switching circuit.
Figure 23:
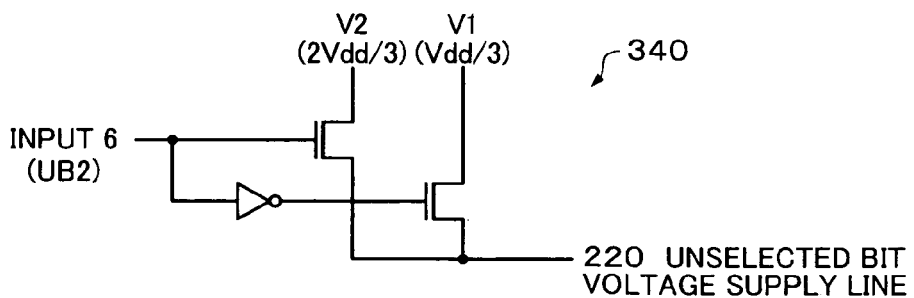
FIG. 23 shows a power switching circuit.

A control circuit 500 of the comparative example is shown in FIG. 19. Delay circuits 501 to 507 in FIG. 19 each have a plurality of individual inverters INV as shown in FIG. 12. If a trigger signal trig is input to the control circuit 500 of FIG. 19, the operation of the delay circuits 501 to 507 ensures that signals (the signals SW3, SBO, UB2, SB3, SW0, and UW2) that control the output voltages of the voltage supply lines 210 to 240 are sequentially transmitted to the voltage selection circuit 300. The voltage selection circuit 300 determines the voltage to the output to the voltage supply lines 210 to 240, based on the received signals. Note that switching circuits 310 to 340 for processing the received signals are also provided for the voltage supply lines 210 to 240. The switching circuits 310 to 340 are shown in FIGS. 20 to 23. The operation of the control circuit 500 provides the applied voltage waveform chart shown in FIG. 24.

Figure 24:
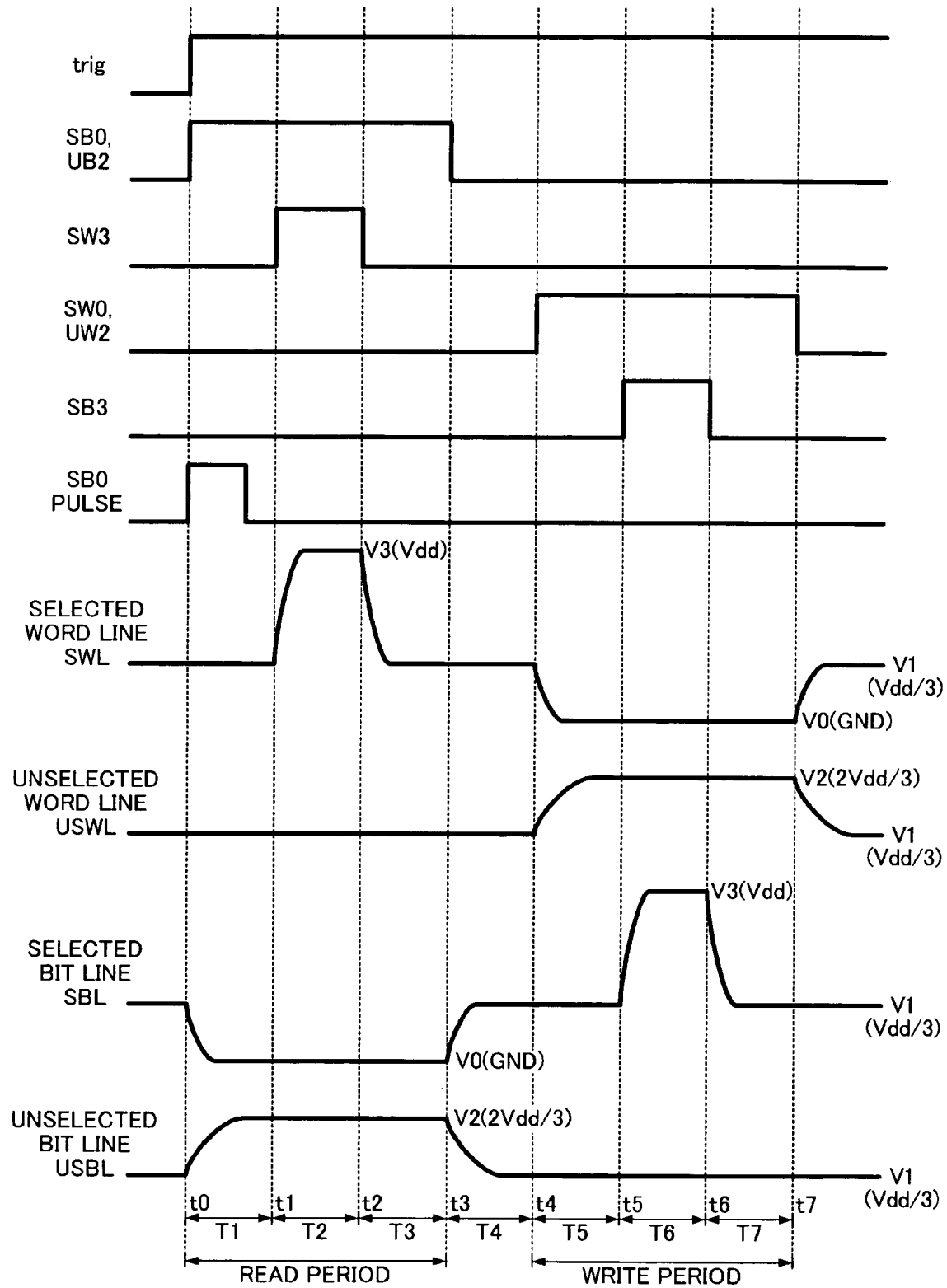
FIG. 24 is a timing chart illustrating an operation of the comparative example.

FIG. 24 is a waveform chart of the voltages applied to the selected word line SWL, unselected word line USWL, the selected bit line SBL, and the unselected bit line USBL of the comparative example. A timing chart of the signals that are output from the control circuit 500 of FIG. 18 is shown in FIG. 24, simultaneously with the previously described waveform chart of applied voltages.

Each of time intervals T1 to T7 in FIG. 24 are time intervals creates by the delay circuits 501 to 507 of FIG. 19. A read period (time intervals T1 to T3) of FIG. 24 represents a period during which a selected memory cell is read ("0" write) and a write period (time intervals T5 to T7) of FIG. 24 represents a period during which the selected memory cell is written to ("1" write).

As can be seen from FIG. 24, the timings at which voltages are applied to the selected bit line SBL and the unselected bit line USBL and the timing of the start of the supply of Vdd to the selected word line SWL are shifted in time by the time interval T1. Similarly, the timings at which voltages are applied to the selected word line SWL and the unselected word line during the write period and the timing of the start of the supply of Vdd to the selected bit line SBL are shifted in time by the time interval T5. These time intervals are provided because it is necessary to consider discrepancies in the gradients at which the voltages rise.

For that reason, a time lag (in other words, the time interval T1 or T5) is provided in the timings at which the voltages are applied to the selected word line SWL and the plurality of bit lines 50 or the selected bit line SBL and the plurality of word lines 40, as shown in FIG. 24, to ensure that no voltage other than the unselection voltage is applied to the unselected memory cells. For a similar reason, the time intervals T3 and T7 are provided from consideration of discrepancies in the gradients at which the voltages fall.

In addition, the time interval T4 is provided between the read period and the write period, as shown in FIG. 24. This time interval T4 is a standby period until the voltage values of the unselected word line USWL and the unselected bit line USBL (hereinafter called the unselected lines) have stabilized. This time interval T4 is necessary because the unselected lines have large wiring capacitances.

Figure 25:
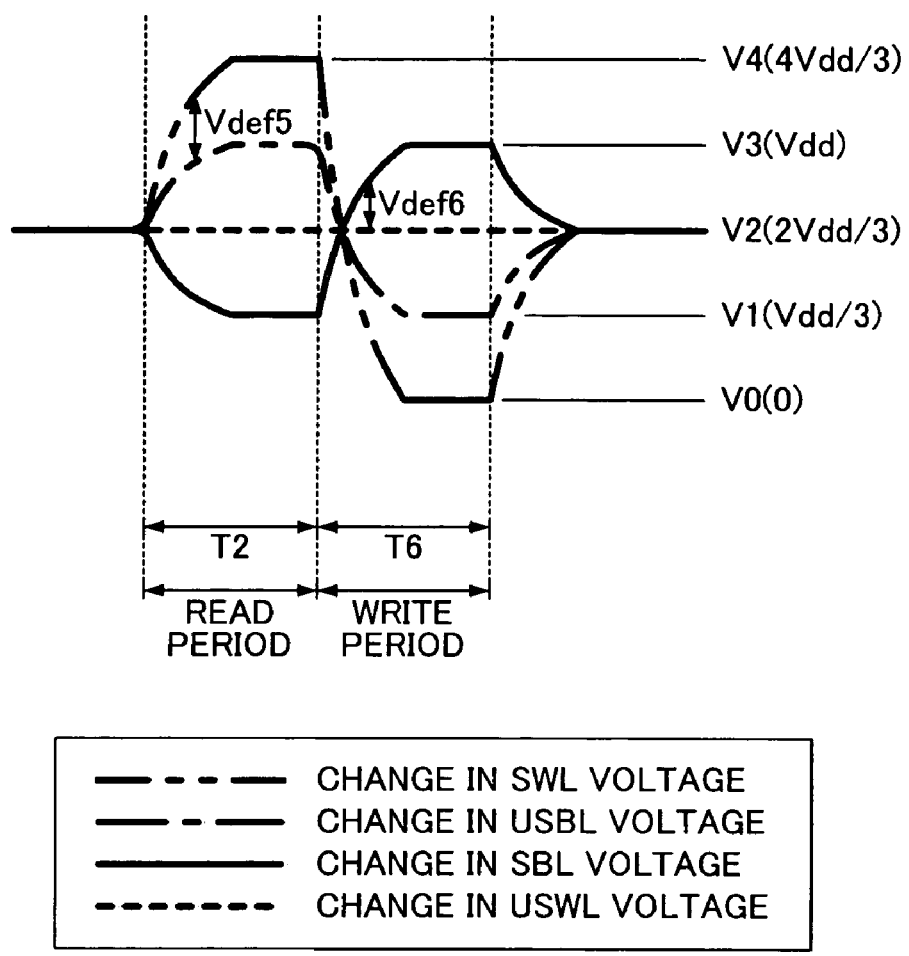
FIG. 25 shows the four different waveforms of FIG. 17 superimposed.

To facilitate understanding of the voltage relationships between the selected word line SWL, the unselected word line USWL, the selected bit line SBL, and the unselected bit line USBL, the waveforms of FIG. 17 are shown superimposed in FIG. 25.

A comparison of FIG. 24 for the comparative example and FIG. 25 for this embodiment makes it clear that there is a huge difference in memory access time. In this case, "memory access time" is the time required until the reading and writing of the memory cell 30 are completed. In other words, the use of this embodiment enables an improvement in memory access speed.

Vdef5 in FIG. 25 denotes difference between the voltage of the selected word line SWL and the voltage of the unselected bit line USBL, and Vdef6 denotes the voltage difference between the selected bit line SBL and the unselected word line USWL. The potential gradient correction section 100 of FIG. 1 ensures that the voltage rise in the selected word line SWL is adjusted to that the voltage difference Vdef5 does not exceed the voltage Vdd/3. Since the unselected word line USWL is fixed at the voltage V2 (2Vdd/3), the voltage difference Vdef6 does not exceed the voltage Vdd/3.

This makes it possible to remove the time intervals T1, T3, T5, and T6 from this embodiment, although they are essential in the comparative example. It is also necessary with the comparative example to switch the voltages of the unselected-bit-line-voltage-supply-line 220 and the unselected-word-line-voltage-supply-line 240 at every read and write. That is why the time interval T4 of FIG. 24 is necessary. It should be obvious from the waveform chart of FIG. 25, however, that the voltage of the unselected word line USWL is always fixed at (2Vdd/3) throughout the sequence of operations involved in reading and writing. In other words, the operation of switching the output voltage of the unselected-word-line-voltage-supply-line 240 at every read and write is no longer necessary. This embodiment thus makes it possible to omit the time interval T4 that is essential in the comparative example. In addition, the synergistic effect achieved by the provision of the potential gradient correction section 100 and the fixing of the voltage of the unselected-word-line-voltage-supply-line 240 makes it possible provide the potential gradient correction section 100 only in the selected-word-line-voltage-supply-line 230.

Second Embodiment

A second embodiment is described below, with reference to the accompanying figures.

Basic Configuration of Ferroelectric Memory Device

Figure 26:
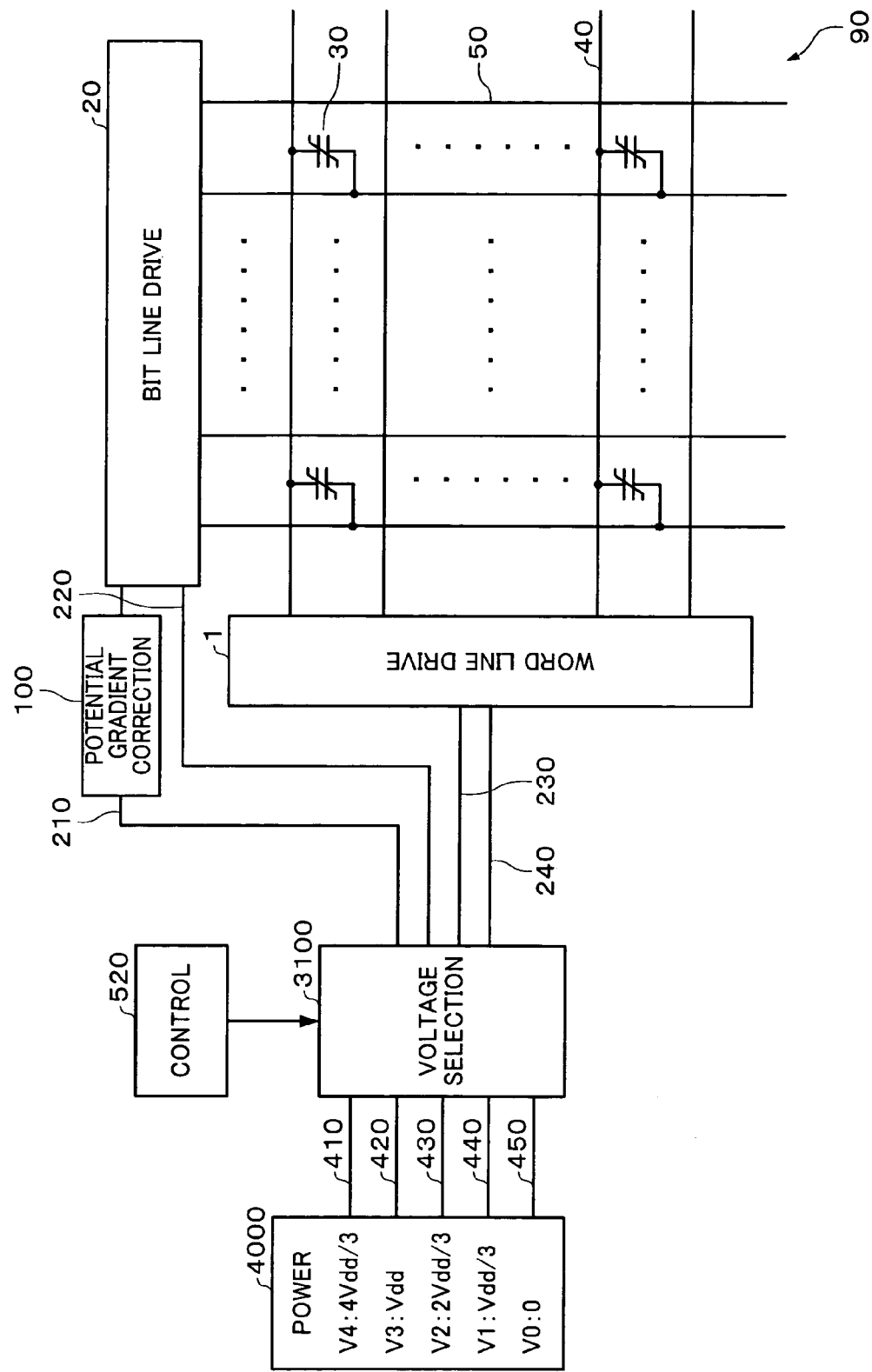
FIG. 26 is a block diagram of a ferroelectric memory device in accordance with a second embodiment.

A block diagram of a ferroelectric memory device in accordance with this embodiment is shown in FIG. 26.

In FIG. 26, the location of the potential gradient correction section 100 differs from that of the first embodiment. In this embodiment, the potential gradient correction section 100 is provided in the selected-bit-line-voltage-supply-line 210. A voltage selection circuit 3100 is used in this embodiment instead of the voltage selection circuit 3000. The voltage selection circuit 3100 has power switching circuits 375, 385, and 395. The rest of the basic configuration is similar to that of the first embodiment.

Reading and Writing

Figure 27:
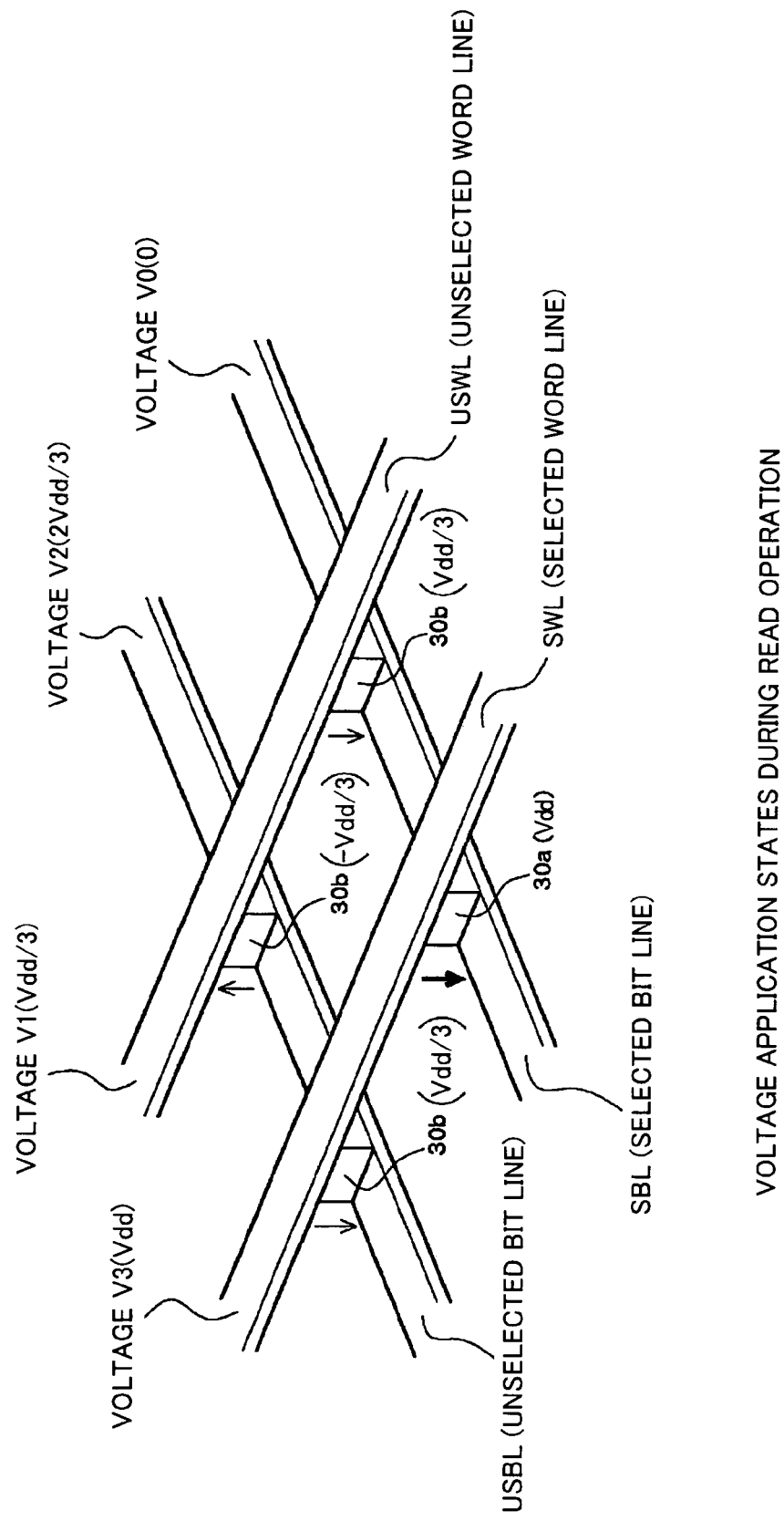
FIG. 27 shows voltage application states during a read operation of the ferroelectric memory device of the second embodiment.

The state of voltages applied during a read in accordance with this embodiment is shown in FIG. 27. Note that the reference numbers used in this figure are the same as those of FIG. 5. As shown in FIG. 27, the voltage V3 (Vdd) is supplied to the selected word line SWL and the voltage V1 (Vdd/3) is supplied to the unselected word line USWL. The voltage V0 (0) is supplied to the selected bit line SBL. The voltage V2 (2Vdd/3) is supplied to the unselected bit line USBL.

Figure 28:
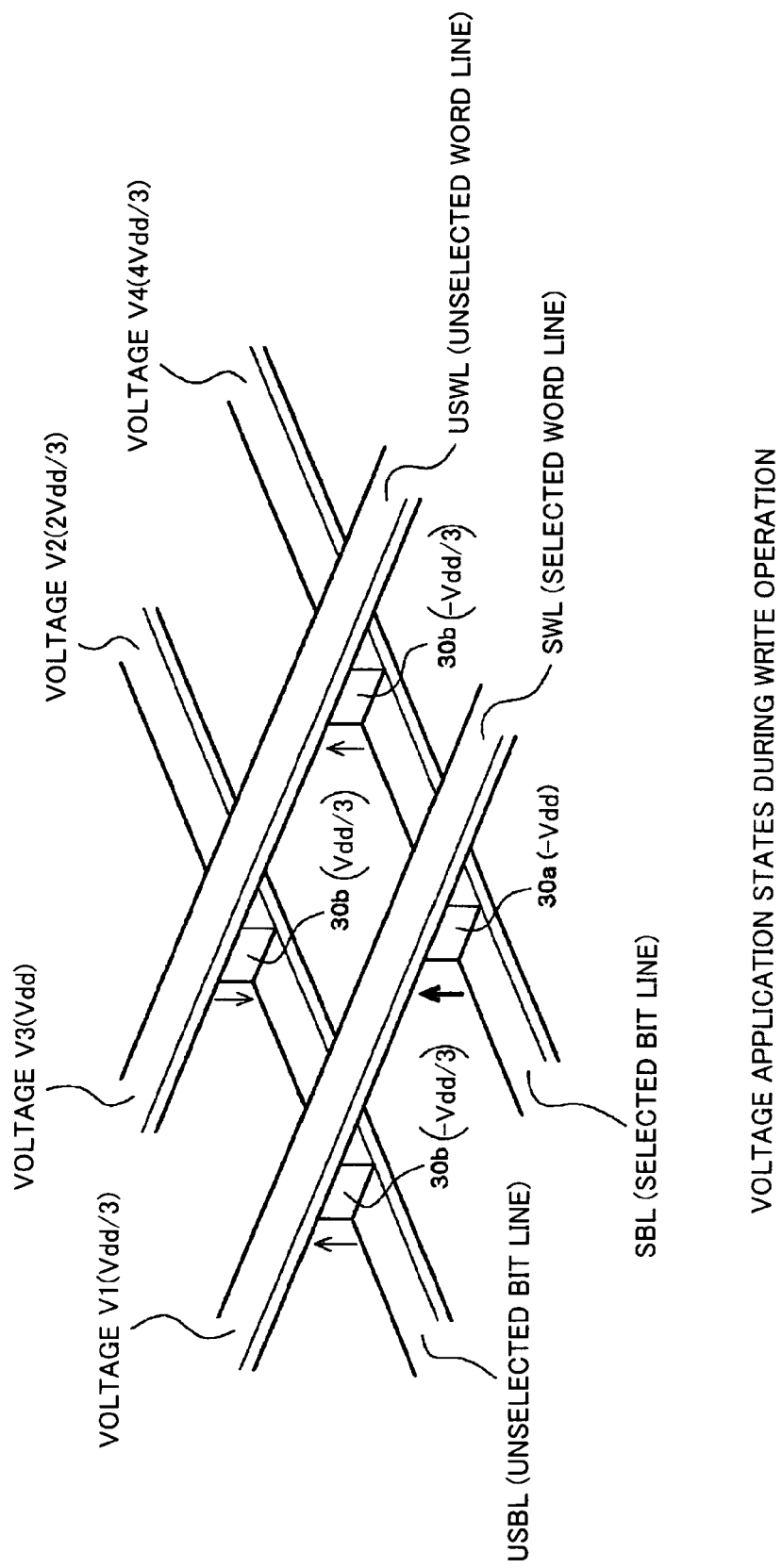
FIG. 28 shows voltage application states during a write operation of the ferroelectric memory device of the second embodiment.

The state of voltages applied during a read in accordance with this embodiment is shown in FIG. 28. Note that the reference numbers used in this figure are the same as those of FIG. 5. As shown in FIG. 28, the voltage Vdd/3 is supplied to the selected word line SWL and the voltage Vdd is supplied to the unselected word line USWL. The voltage 4Vdd/3 is supplied to the selected bit line SBL. The voltage 2Vdd/3 is supplied to the unselected bit line USBL.

The voltages applied to each word line 40 and each bit line 50 in this embodiment differ from those of the first embodiment. In the first embodiment, the voltage of the unselected-word-line-voltage-supply-line 240 was fixed at (2Vdd/3), but in this embodiment it is the voltage of the unselected-bit-line-voltage-supply-line 220 that is fixed at (2Vdd/3). As can be clearly seen from FIGS. 27 and 28, however, the voltage applied to the selected memory cell and the voltage applied to each unselected memory cell are the same as those of the first embodiment.

Control Circuit and Voltage Selection Circuit

Figure 29:
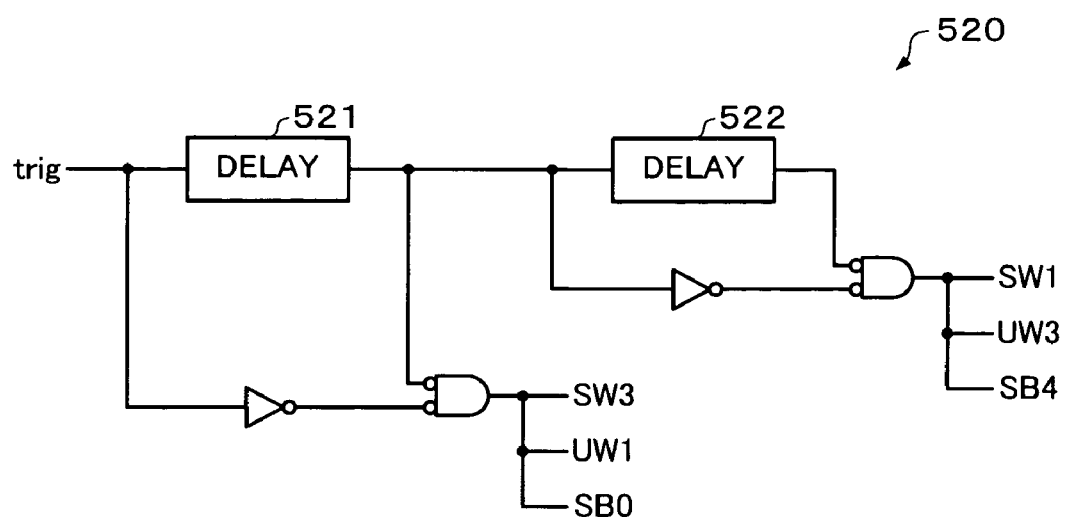
FIG. 29 shows a control circuit of the second embodiment.

A logic circuit diagram of a control circuit 520 is shown in FIG. 29.

This control circuit 520 controls the voltage that are selected and output by the voltage selection circuit 3100. The control circuit 520 has delay circuits 521 and 522. The signals (SW3, UW1, SB0, SW1, UW3, and SB4) from the control circuit 520 flow through the power switching circuits 375, 385, and 395 within the voltage selection circuit 3100 of FIG. 26. The relationships between these signals (SW3, UW1, SB0, SW1, UW3, and SB4) and the power switching circuits 375, 385, and 395 are described below.

Figure 30:
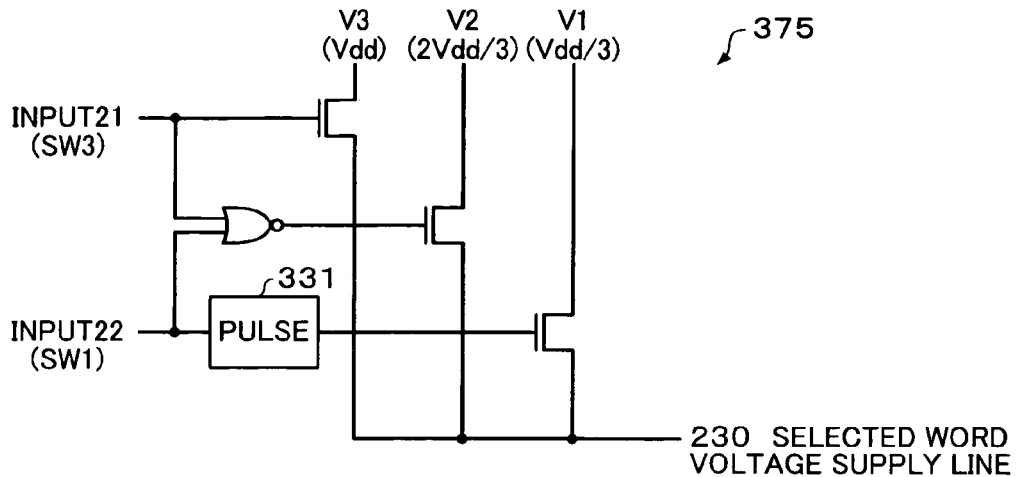
FIG. 30 shows a power switching circuit.
Figure 31:
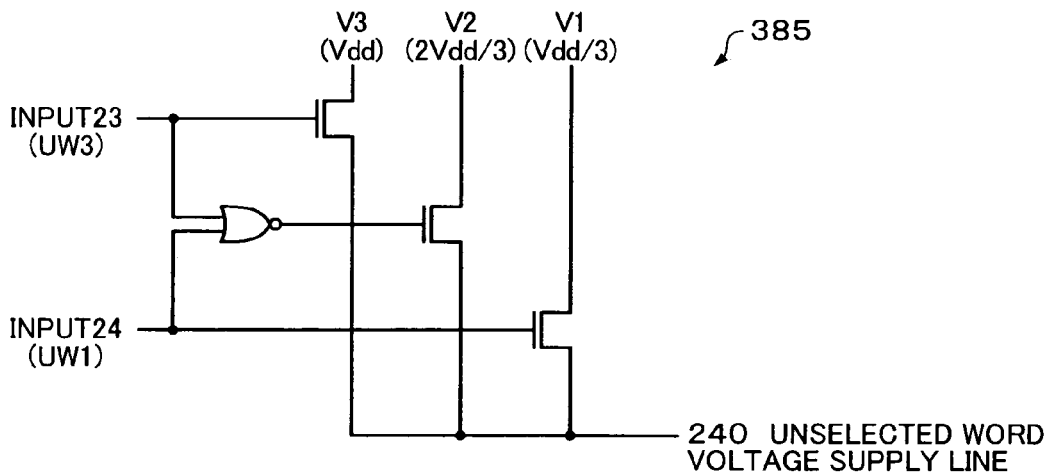
FIG. 31 shows a power switching circuit.
Figure 32:
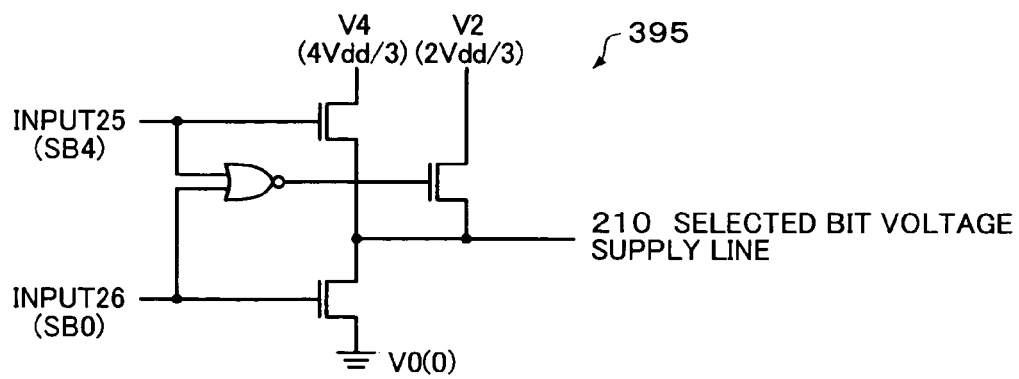
FIG. 32 shows a power switching circuit.

The power switching circuit 375 is shown in FIG. 30, the power switching circuit 385 is shown in FIG. 31, and the power switching circuit 395 is shown in FIG. 32.

The power switching circuit 375 of FIG. 30 switches the voltage that is output to the selected-word-line-voltage-supply-line 230. More specifically, when the signal SW3 of the control circuit 520 is input to an input 21 of the power switching circuit 375, the power switching circuit 375 outputs the voltage Vdd to-the selected-word-line-voltage-supply-line 230. Similarly, when the signal SW1 of the control circuit 520 is input to an input 22, the power switching circuit 375 outputs the voltage Vdd/3 to the selected-word-line-voltage-supply-line 230. If no signals are input to the inputs 21 and 22, the power switching circuit 375 outputs the voltage 2Vdd/3 to the selected-word-line-voltage-supply-line voltage-supply-line 230. Note that the pulse circuit 331 of FIG. 30 is equivalent to that of the comparative example of FIG. 16.

The power switching circuit 385 of FIG. 31 switches the voltage that is output to the unselected-word-line-voltage-supply-line 240. More specifically, when the signal UW3 of the control circuit 520 is input to an input 23 of the power switching circuit 385, the power switching circuit 385 outputs the voltage Vdd to the unselected-word-line-voltage-supply-line 240. Similarly, when the signal UW1 of the control circuit 520 is input to an input 24, the power switching circuit 385 outputs the voltage Vdd/3 to the unselected-word-line-voltage-supply-line 240. If no signals are input to the inputs 23 and 24, the power switching circuit 385 outputs the voltage 2Vdd/3 to the unselected-word-line-voltage-supply-line 240.

The power switching circuit 395 of FIG. 32 switches the voltage that is output to the selected-bit-line-voltage-supply-line 210. More specifically, when the signal SB4 of the control circuit 520 is input to an input 25 of the power switching circuit 395, the power switching circuit 395 outputs the voltage 4Vdd/3 to the selected-bit-line-voltage-supply-line 210. Similarly, when the signal SB0 of the control circuit 520 is input to an input 26, the power switching circuit 395 outputs the voltage V0 (0) to the selected-bit-line-voltage-supply-line 210. If no signals are input to the inputs 25 and 26, the power switching circuit 395 outputs the voltage 2Vdd/3 to the selected-bit-line-voltage-supply-line 210.

Comparison between this Embodiment and Comparative Example

Figure 33:
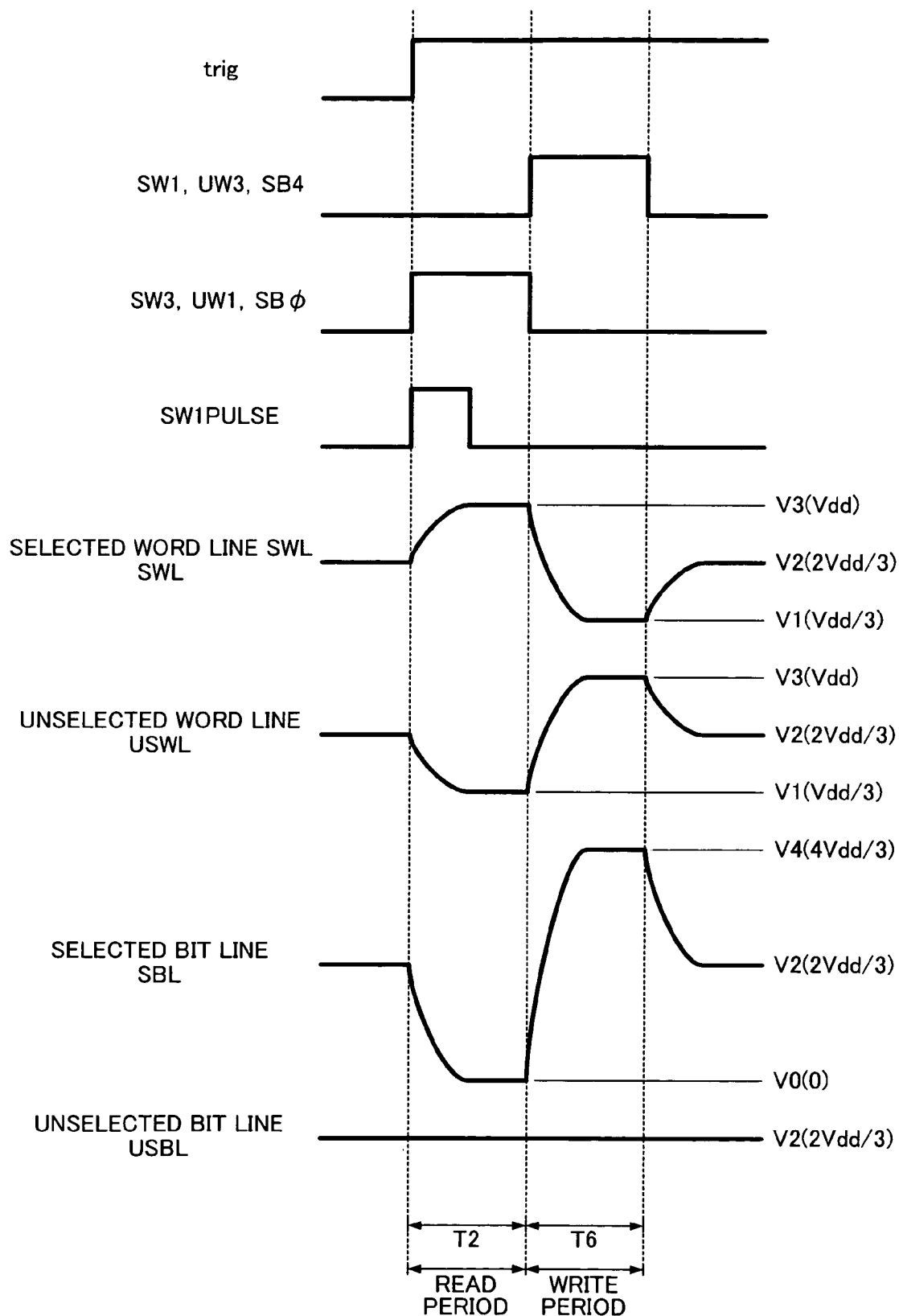
FIG. 33 is a timing chart illustrating an operation of the second embodiment.

A waveform chart of the voltages of the word lines 40 and the bit lines 50 due to the operation of the control circuit 520 and the power switching circuits 375 to 395 is shown in FIG. 33.

The reference numbers used in this figure are the same as those of FIG. 17. In this embodiment, the voltage of the unselected bit line USBL is fixed at 2Vdd/3.

The waveforms of the applied voltages of FIG. 33 are shown superimposed in FIG. 34. The reference numbers used in this figure are the same as those of FIG. 25. Vdef7 denotes the voltage difference between the selected bit line SBL and the unselected word line USWL and Vdef8 denotes the voltage difference between the selected word line SWL and the unselected bit line USBL. In this embodiment, the voltage difference Vdef7 does not exceed the voltage Vdd/3 because of the provision of the potential gradient correction section 100 in the selected-bit-line-voltage-supply-line 210. In addition, the voltage difference Vdef8 does not exceed the voltage Vdd/3 because the unselected bit line USBL is at a fixed potential. The voltage of the unselected bit line USBL is fixed so the time interval T4 that is necessary in the comparative example is omitted. In other words, the first and second embodiments ensure that the time interval T4 can be omitted, so that either the voltage of the unselected bit line USBL or the voltage of the unselected word line USWL can be fixed. Since the voltage of the unselected bit line USBL is fixed, the potential gradient correction section 100 need only be provided for the selected-bit-line-voltage-supply-line 210. As is clear from the above, the second embodiment exhibits effects similar to those of the first embodiment.

The above configuration ensures that this embodiment of the ferroelectric memory device implements a shortening of memory access times.

Note that the present invention is not limited to the above-described embodiments and thus various modifications thereto are possible within the scope of the invention as laid out herein.

What is claimed is:

1. A ferroelectric memory device comprising:
   a plurality of word lines disposed to be mutually parallel;
   a plurality of bit lines disposed to be mutually parallel, intersecting the word lines;
   a plurality of ferroelectric memory cells disposed at intersections of the word lines and the bit lines;
   a word line drive section which drives the word lines;
   a bit line drive section which drives the bit lines;
   a selected-word-line-voltage-supply-line and an unselected-word-line-voltage-supply-line which are connected to the word line drive section;
   a selected-bit-line-voltage-supply-line and an unselected-bit-line-voltage-supply-line which are connected to the bit line drive section;
   a power circuit which generates a plurality of different voltages;
   a voltage selection circuit which selectively outputs the different voltages to the selected-word-line-voltage-supply-line, the unselected-word-line-voltage-supply-line, the selected-bit-line-voltage-supply-line, and the unselected-bit-line-voltage-supply-line; and
   a potential gradient correction section which reduces one of a first difference in potential gradient between the selected-word-line-voltage-supply-line and the unselected-bit-line-voltage-supply-line and a second difference in potential gradient between the selected-bit-line-voltage-supply-line and the unselected-word-line-voltage-supply-line,
   wherein the word line drive section and the bit line drive section apply a positive or negative selection voltage to a selected memory cell from among the ferroelectric memory cells and an unselection voltage to the remaining unselected memory cells, wherein, when either the positive or the negative selection voltage is applied to the selected memory cell, the voltage selection circuit fixes the potential of the unselected-word-line-voltage-supply-line in a case where the potential gradient correction section reduces the first difference in potential gradient, and fixes the potential of the unselected-bit-line-voltage-supply-line in a case where the potential gradient correction section reduces the second difference in potential gradient.

2. The ferroelectric memory device as defined in claim 1, wherein the potential gradient correction section sets the magnitude of a voltage corresponding to one of the first and second differences in potential gradient which is to be reduced to be equal to or less than the magnitude of the unselection voltage.

3. The ferroelectric memory device as defined in claim 1, wherein the potential gradient correction section reduces the potential gradient of one of the selected-word-line-voltage-supply-line and the selected-bit-line-voltage-supply-line.

4. The ferroelectric memory device as defined in claim 3, wherein the potential gradient correction section increases an interconnect load of one of the selected-word-line-voltage-supply-line and the selected-bit-line-voltage-supply-line.

5. The ferroelectric memory device as defined in claim 3, wherein the potential gradient correction section reduces the amount of current flowing per unit time in one of the selected-word-line-voltage-supply-line and the selected-bit-line-voltage-supply-line so as to close to the amount of current flowing per unit time in one of the unselected-word-line-voltage-supply-line and the unselected-bit-line-voltage-supply-line having an unfixed potential.

6. The ferroelectric memory device as defined in claim 1, wherein the potential gradient correction section increases the potential gradient of one of the unselected-word-line-voltage-supply-line and the unselected-bit-line-voltage-supply-line.

7. The ferroelectric memory device as defined in claim 6, wherein the potential gradient correction section increases the amount of current flowing per unit time in one of the unselected-word-line-voltage-supply-line and the unselected-bit-line-voltage-supply-line having an unfixed potential so as to close to the amount of current flowing per unit time, in one of the selected-word-line-voltage-supply-line and the selected-bit-line-voltage-supply-line.

8. The ferroelectric memory device as defined in claim 1, further comprising:

a control circuit which outputs to the voltage selection circuit a timing signal for switching the different voltages for output to the selected-word-line-voltage-supply-line, the selected-bit-line-voltage-supply-line, and one of the unselected-word-line-voltage-supply-line and the unselected-bit-line-voltage-supply-line having an unfixed potential.

9. The ferroelectric memory device as defined in claim 8, wherein the control circuit outputs a signal for switching between the potential of the selected-bit-line-voltage-supply-line and the potential of one of the unselected-bit-line-voltage-supply-line and the unselected-word-line-voltage-supply-line having an unfixed voltage, substantially simultaneously with the timing at which the selected-word-line-voltage is supplied to the selected-word-line-voltage-supply-line.

10. The ferroelectric memory device as defined in claim 8, wherein the control circuit outputs a signal for switching between the potential of the selected-word-line-voltage-supply-line and the potential of one of the unselected-bit-line-voltage-supply-line and the unselected-word-line-voltage-supply-line having an unfixed potential, substantially simultaneously with the timing at which a selected-bit line-voltage is supplied to the selected-bit-line-voltage-supply-line.

11. The ferroelectric memory device as defined in claim 1, wherein the power circuit generates five different voltages having the relationship V0<V1<V2<V3<V4; and wherein the voltage selection circuit fixes the voltage of the unselected-word-line-voltage-supply-line at the voltage V2, operates to supply the voltage V4 to the selected-word-line-voltage-supply-line, the voltage V3 to the unselected-bit-line-voltage-supply-line, and the voltage V1 to the selected-bit-line-voltage-supply-line when the positive selection voltage is applied to the selected memory cell, and operates to supply the voltage V0 to the selected-word-line-voltage-supply-line, the voltage V1 to the unselected-bit-line-voltage-supply-line, and the voltage V3 to the selected-bit-line-voltage-supply-line when the negative selection voltage is applied to the selected memory cell.

12. The ferroelectric memory device as defined in claim 11, further comprising:

a control circuit which outputs to the voltage selection circuit a timing signal for switching the different voltages for output to the selected-word-line-voltage-supply-line, the selected-bit-line-voltage-supply-line, and one of the unselected-bit-line-voltage-supply-line and the unselected-word-line-voltage-supply-line having an unfixed potential, wherein the control circuit outputs a signal for switching the voltage V4 of the selected-word-line-voltage-supply-line to the voltage V2, after the positive selection voltage is applied to the selected memory cell, and then outputs signals for substantially simultaneously switching the voltage V2 of the selected-word-line-voltage-supply-line to the voltage V0, the voltage V3 of the unselected-bit-line-voltage-supply-line to the voltage V1, and the voltage V1 of the selected-bit-line-voltage-supply-line to the voltage V2.

13. The ferroelectric memory device as defined in claim 1, wherein the power circuit generates five different voltages having the relationship V0<V1<V2<V3<V4; and wherein the voltage selection circuit fixes the unselected-bit-line-voltage-supply-line supply-line to the voltage V2, operates to supply the voltage V3 to the selected-word-line-voltage-supply-line, the voltage V1 to the unselected-word-line-voltage-supply-line, and the voltage V0 to the selected-bit-line-voltage-supply-line when the positive selection voltage is applied to the selected memory cell, and operates to supply the voltage V1 to the selected-word-line-voltage-supply-line, the voltage V3 to the unselected-word-line-voltage-supply-line, and the voltage V4 to the selected-bit-line-voltage-supply-line when the negative selection voltage is applied to the selected memory cell.

14. The ferroelectric memory device as defined in claim 13, further comprising:

a control circuit which outputs to the voltage selection circuit a timing signal for switching the different voltages for output to the selected-word-line-voltagesupply-line, the selected-bit-line-voltage-supply-line, and one of the unselected-bit-line-voltage-supply-line and the unselected-word-line-voltage-supply-line having an unfixed potential, wherein the control circuit outputs a signal for switching the voltage V3 of the selected-word-line-voltage-supply-line to the voltage V1, after the positive selection voltage is applied to the selected memory cell, and then outputs signals for substantially simultaneously switching the voltage V1 of the unselected-word-line-voltage-supply-line to the voltage V3, and the voltage V0 of the selected-bit-line-voltage-supply-line to the voltage V2.

* * * * *